United States Patent
Gosen et al.

(10) Patent No.: US 8,810,769 B2
(45) Date of Patent: Aug. 19, 2014

(54) LITHOGRAPHIC APPARATUS, AN ILLUMINATION SYSTEM, A PROJECTION SYSTEM AND A METHOD OF MANUFACTURING A DEVICE USING A LITHOGRAPHIC APPARATUS

(75) Inventors: Jeroen Gerard Gosen, Geldrop (NL); Antonius Johannus Van Der Net, Tilburg (NL); Bart Dinand Paarhuis, Waalre (NL); Frank Johannes Jacobus Van Boxtel, Eindhoven (NL); Jinggao Li, Fairfield, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 656 days.

(21) Appl. No.: 13/050,476

(22) Filed: Mar. 17, 2011

(65) Prior Publication Data

US 2011/0228239 A1 Sep. 22, 2011

Related U.S. Application Data

(60) Provisional application No. 61/315,786, filed on Mar. 19, 2010, provisional application No. 61/350,666, filed on Jun. 2, 2010, provisional application No. 61/386,422, filed on Sep. 24, 2010.

(51) Int. Cl.
*G03B 27/52* (2006.01)
(52) U.S. Cl.
USPC .......................................................... 355/30
(58) Field of Classification Search
USPC .......................................................... 355/30
See application file for complete search history.

(56) References Cited

U.S. PATENT DOCUMENTS

| | | | |
|---|---|---|---|
| 4,509,852 A | 4/1985 | Tabarelli et al. | |
| 5,877,843 A * | 3/1999 | Takagi et al. | 355/30 |
| 5,997,963 A * | 12/1999 | Davison et al. | 427/582 |
| 6,731,371 B1 * | 5/2004 | Shiraishi | 355/30 |
| 7,570,342 B2 * | 8/2009 | Simon et al. | 355/30 |

(Continued)

FOREIGN PATENT DOCUMENTS

| | | |
|---|---|---|
| EP | 1 420 300 | 5/2004 |
| JP | 2003-007577 | 1/2003 |

(Continued)

OTHER PUBLICATIONS

Machine translation of JP 2003-234281.*

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

A gas curtain is provided to separate a component of a lithographic apparatus from contaminated gas. The gas curtain is supplied by an opening. The opening is at a boundary of a protection environment with which a surface of the component comes into contact. The gas curtain may separate the component from a moving part of the apparatus.

20 Claims, 12 Drawing Sheets

(56) References Cited

U.S. PATENT DOCUMENTS

| | | | |
|---|---|---|---|
| 7,738,076 B2 * | 6/2010 | Hasegawa et al. | 355/30 |
| 7,924,398 B2 * | 4/2011 | Shima | 355/30 |
| 2002/0018190 A1 * | 2/2002 | Nogawa et al. | 355/30 |
| 2002/0112784 A1 * | 8/2002 | Tanaka et al. | 148/213 |
| 2002/0191163 A1 * | 12/2002 | Hasegawa et al. | 355/30 |
| 2002/0191166 A1 * | 12/2002 | Hasegawa et al. | 355/53 |
| 2003/0006380 A1 * | 1/2003 | Van Empel et al. | 250/492.3 |
| 2004/0136494 A1 | 7/2004 | Lof et al. | |
| 2004/0207824 A1 | 10/2004 | Lof et al. | |
| 2005/0030496 A1 * | 2/2005 | Chibana et al. | 355/30 |
| 2005/0105067 A1 | 5/2005 | Chibana | |
| 2006/0038968 A1 | 2/2006 | Kemper et al. | |
| 2006/0055899 A1 * | 3/2006 | Van Der Net et al. | 355/30 |
| 2006/0119809 A1 | 6/2006 | Verhagen et al. | |
| 2012/0249983 A1 * | 10/2012 | Vogel et al. | 355/53 |

FOREIGN PATENT DOCUMENTS

| | | |
|---|---|---|
| JP | 2003-234281 | 8/2003 |
| JP | 2003-257845 | 9/2003 |
| JP | 2004-266051 | 9/2004 |
| JP | 2005-150533 | 6/2005 |
| WO | 99/49504 | 9/1999 |
| WO | 2005/064405 | 7/2005 |

OTHER PUBLICATIONS

Japanese Office Action mailed Sep. 4, 2012 in corresponding Japanese Patent Application No. 2011-055343.

* cited by examiner

LITHOGRAPHIC APPARATUS, AN ILLUMINATION SYSTEM, A PROJECTION SYSTEM AND A METHOD OF MANUFACTURING A DEVICE USING A LITHOGRAPHIC APPARATUS This application claims priority and benefit under 35 U.S.C. §119(e) to U.S. Provisional Patent Application No. 61/315,786, entitled "A Lithographic Apparatus and A Method Of Manufacturing A Device Using A Lithographic Apparatus", filed on Mar. 19, 2010, to U.S. Provisional Patent Application No. 61/350,666, entitled "A Lithographic Apparatus, An Illumination System, A Projection System and a Method of Manufacturing a Device Using a Lithographic Apparatus", filed on Jun. 2, 2010, and to U.S. Provisional Patent Application No. 61/386,422, entitled "A Lithographic Apparatus, An Illumination System, A Projection System and a Method of Manufacturing a Device Using a Lithographic Apparatus", filed on Sep. 24, 2010. The contents of each of the foregoing application s is incorporated herein in its entirety by reference.

FIELD

The present invention relates to a lithographic apparatus, an illumination system for a lithographic apparatus, a projection system for a lithographic apparatus and a method of manufacturing a device using a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

An illumination system is configured to condition the radiation beam before the radiation reaches the reticle. Once the radiation beam has been patterned by the reticle, a projection system directs the radiation to the substrate. The illumination system and the projection system comprise optics. The optics of the projection system may be situated within an ultra-clean gas environment to prolong the lifetime of the optics of the projection system. The ultra-clean gas environment may be termed a protective environment, or a micro environment. This environment reduces the optics contamination (both cleanable and non-cleanable), thereby reducing the degradation in radiation beam uniformity and reducing the amount of stray radiation lost from the system.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a liquid handling system, device, structure or apparatus. In an embodiment the liquid handling structure may supply immersion fluid and therefore be a fluid supply system. In an embodiment the liquid handling structure may at least partly confine immersion fluid and thereby be a fluid confinement system. In an embodiment the liquid handling structure may provide a barrier to immersion fluid and thereby be a barrier member, such as a fluid confinement structure. In an embodiment the liquid handling structure may create or use a flow of gas, for example to help in controlling the flow and/or the position of the immersion fluid. The flow of gas may form a seal to confine the immersion fluid so the liquid handling structure may be referred to as a seal member; such a seal member may be a fluid confinement structure. In an embodiment, immersion liquid is used as the immersion fluid. In reference to the aforementioned description, reference in this paragraph to a feature defined with respect to fluid may be understood to include a feature defined with respect to liquid. In an embodiment of the invention, a lithographic apparatus does not comprise a liquid handling structure.

SUMMARY

In a lithographic apparatus, a component may become contaminated by compounds in a gas to which the component is exposed. The contamination may pose a defectively risk. For example, a contaminated optic may result in a lack of uniformity of the radiation beam. This may adversely affect the imaged pattern on the substrate.

It is desirable, for example, to reduce or eliminate the risk of such contamination.

According to an aspect of the invention, there is provided a lithographic apparatus comprising:

a component with a protected surface in contact with a protection gas; and a protector comprising at least one opening configured to direct a gas flow to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided a lithographic apparatus comprising:

a component with a protected surface;

a surface shield configured to direct a flow of protection gas along a path contiguous to the protected surface to protect the protected surface; and a protector comprising at least one opening configured to direct a gas flow distinct from the flow of protection gas, wherein the gas flow substantially prevents gas from reaching a same side of the gas flow as the protected surface from an opposite side of the gas flow.

According to an aspect of the invention, there is provided a lithographic apparatus comprising:

an illumination system having an objective, wherein a protected surface of the objective is in contact with a protection gas; and a protector comprising at least one opening configured to direct a gas flow to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided a lithographic apparatus comprising:

a projection system having a lens, wherein a protected surface of the lens is in contact with a protection gas; and a protector comprising at least one opening configured to direct a gas flow to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided an illumination system for a lithographic apparatus configured to condition a radiation beam, the illumination system comprising:

an optical component with a protected surface in contact with a protection gas; and a protector comprising at least one opening configured to direct a gas flow to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided a projection system for a lithographic apparatus configured to project a patterned radiation beam onto a substrate, the projection system comprising:

an optical component with a protected surface in contact with a protection gas; and a protector comprising at least one opening configured to direct a gas flow to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided a method of manufacturing a device using a lithographic apparatus comprising a component with a protected surface in contact with a protection gas, the method comprising:

directing a gas flow from at least one opening to a surface other than the protected surface along a path noncontiguous to the protected surface, wherein the gas flow substantially prevents gas from reaching a same side of the gas flow as the protected surface from an opposite side of the gas flow.

According to an aspect of the invention, there is provided a method of manufacturing a device using a lithographic apparatus comprising a component with a protected surface, the method comprising:

directing a protection gas along a path contiguous to the protected surface to protect the protected surface; and directing a gas flow distinct from the protection gas from at least one opening, wherein the gas flow substantially prevents gas from reaching a same side of the gas flow as the protected surface from an opposite side of the gas flow.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
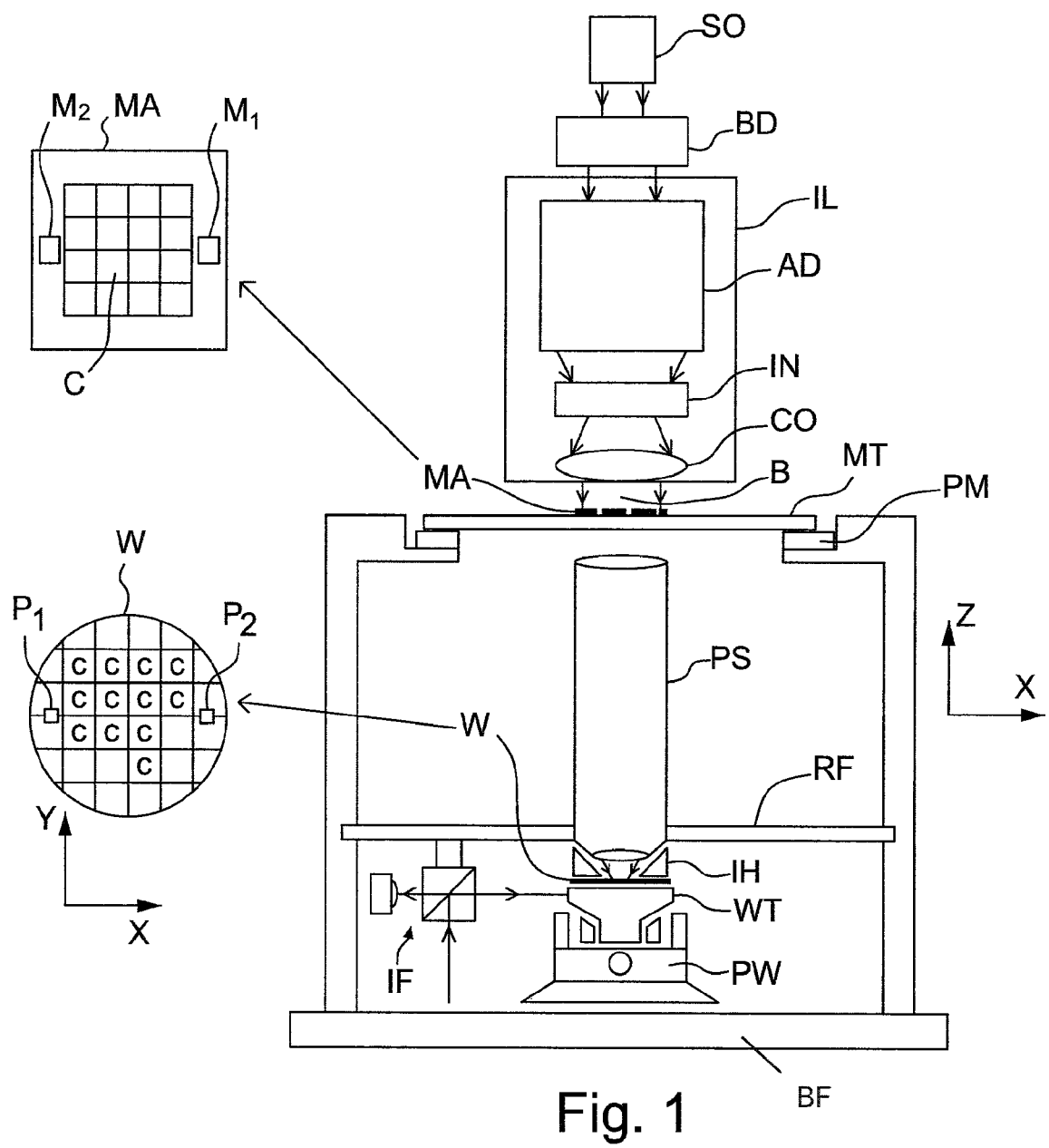
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. It holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions C (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Arrangements for providing liquid between a final element of the projection system and the substrate can be classed into at least two general categories. These are the bath type arrangement and the so-called localized immersion system. In the bath type arrangement substantially the whole of the substrate and optionally part of the substrate table is submersed in a bath of liquid. The so-called localized immersion system uses a liquid supply system in which liquid is only provided to a localized area of the substrate. In the latter category, the space filled by liquid is smaller in plan than the top surface of the substrate and the area filled with liquid remains substantially stationary relative to the projection system while the substrate moves underneath that area. Four different types of localized liquid supply systems are illustrated in FIGS. 2-5.

Figure 2:
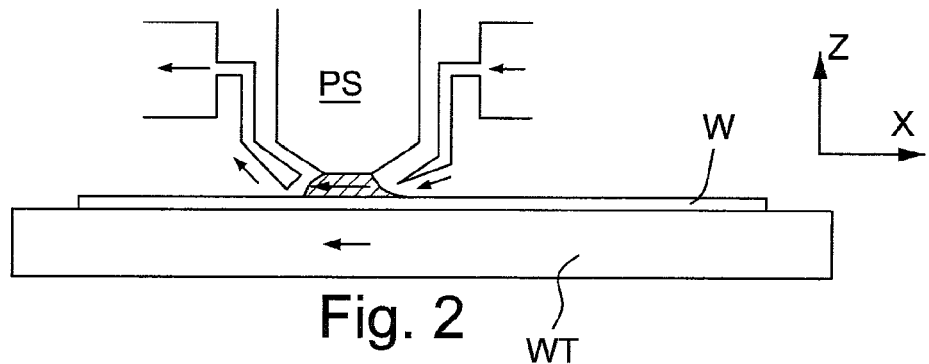
FIGS. 2 and 3 depict a liquid supply system for use in a lithographic projection apparatus.
Figure 3:
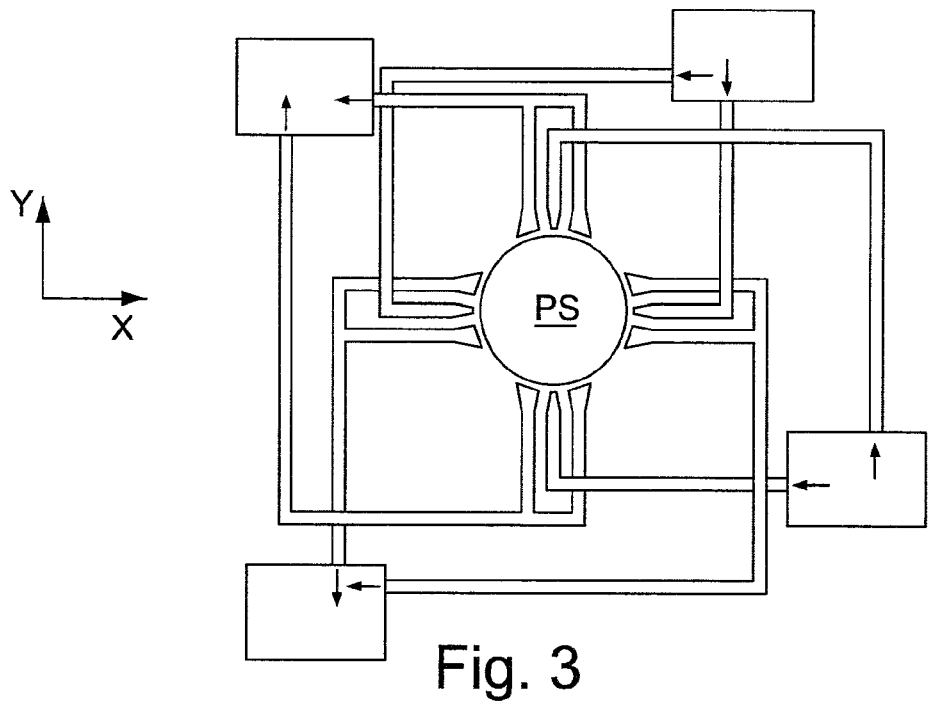

One of the arrangements proposed is for a liquid supply system to provide liquid on only a localized area of the substrate and in between the final element of the projection system and the substrate using a liquid confinement system (the substrate generally has a larger surface area than the final element of the projection system). One way that has been proposed to arrange for this is disclosed in WO 99/49504. As illustrated in FIGS. 2 and 3, liquid is supplied by at least one inlet onto the substrate, desirably along the direction of movement of the substrate relative to the final element, and is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. The arrows above the substrate W illustrate the direction of liquid flow, and the arrow below the substrate W illustrates the direction of movement of the substrate table. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Arrows in liquid supply and liquid recovery devices indicate the direction of liquid flow.

Figure 4:
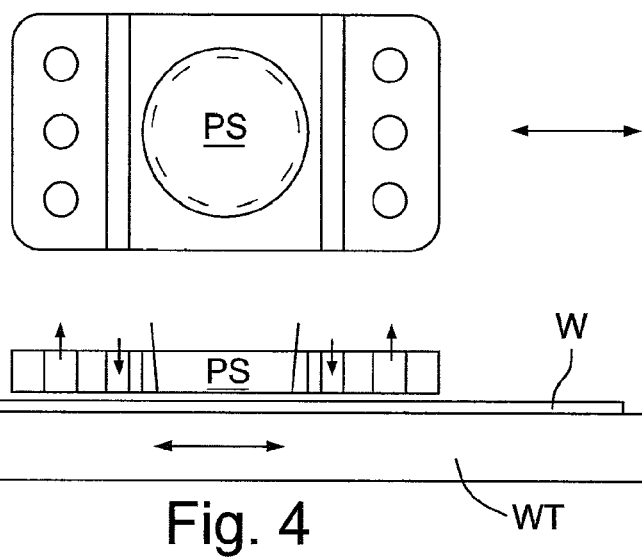
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets. The inlets and outlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). In the cross-sectional view of FIG. 4, arrows illustrate the direction of liquid flow in inlets and out of outlets.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the region between the final element of the projection system and the substrate. That liquid is allowed to leak (or flow) over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate in all positions and which is arranged to have immersion liquid extending between it and the top surface of the substrate and/or substrate table which holds the substrate.

Figure 5:
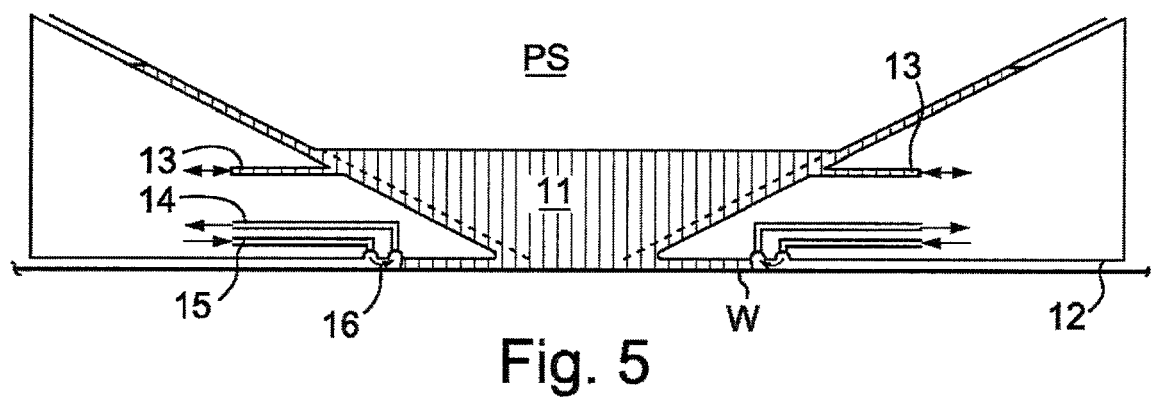
FIG. 5 depicts a further liquid supply system for use in a lithographic projection apparatus.

Another arrangement which has been proposed is to provide the liquid supply system with a fluid confinement structure. The fluid confinement structure may extend along at least a part of a boundary of the space between the final element of the projection system and the substrate table. Such an arrangement is illustrated in FIG. 5. The fluid confinement structure is substantially stationary relative to the projection system in the XY plane though there may be some relative movement in the Z direction (in the direction of the optical axis). A seal is formed between the fluid confinement structure and the surface of the substrate. In an embodiment, a seal is formed between the fluid confinement structure and the surface of the substrate and may be a contactless seal such as a gas seal. Such a system is disclosed in United States patent application publication no. US 2004-0207824. In another embodiment the fluid confinement structure has a seal which is a non-gaseous seal, and so may be referred to as a liquid confinement structure.

FIG. 5 schematically depicts a localized liquid supply system or liquid handling structure 12 or device with a body forming a barrier member or fluid confinement structure, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) The liquid handling structure is substantially stationary relative to the projection system PS in the XY plane though there may be some relative movement in the Z direction (in the direction of the optical axis). In an embodiment, a seal is formed between the liquid handling structure 12 and the surface of the substrate W and may be a contactless seal such as a gas seal or fluid seal.

The liquid handling structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the liquid handling structure 12 positioned below and surrounding the final element of the projection system PS. Liquid is brought into the space 11 below the projection system PS and within the liquid handling structure 12 by liquid inlet 13. The liquid may be removed by liquid outlet 13. The liquid handling structure 12 may extend a little above the final element of the projection system PS. The liquid level rises above the final element so that a buffer of liquid is provided. In an embodiment, the liquid handling structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case. The inner periphery may be any shape, for example the inner periphery may conform to the shape of the final element of the projection system. The inner periphery may be round.

The liquid is contained in the space 11 by the gas seal 16, which, during use, is formed between the bottom of the liquid handling structure 12 and the surface of the substrate W. The gas seal 16 is formed by gas, e.g. air or synthetic air but in an embodiment, $N_2$ or another inert gas. The gas in the gas seal 16 is provided under pressure via inlet 15 to the region between liquid handling structure 12 and substrate W. The gas is extracted via outlet 14. The overpressure on the gas inlet 15, vacuum level on the outlet 14 and geometry of the region are arranged so that there is a high-velocity gas flow inwardly that confines the liquid. The force of the gas on the liquid between the liquid handling structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

The example of FIG. 5 is a so-called localized area arrangement in which liquid is only provided to a localized area of the top surface of the substrate W at any one time. Other arrangements are possible, including liquid handling structures that make use of a single-phase extractor or a two-phase extractor as disclosed, for example, in United States patent application publication no US 2006-0038968. In an embodiment, a single- or two-phase extractor may comprise an inlet that is covered in a porous material. In an embodiment of a single phase extractor the porous material is used to separate liquid from gas to enable single-phase liquid extraction. A chamber downstream of the porous material is maintained at a slight under pressure and is filled with liquid. The under pressure in the chamber is such that the meniscuses formed in the holes of the porous material prevent ambient gas from being drawn into the chamber. However, when the porous surface comes into contact with liquid there is no meniscus to restrict flow and the liquid can flow freely into the chamber. The porous material has a large number of small holes, e.g. of diameter in the range of 5 to 300 μm, desirably 5 to 50 μm. In an embodiment, the porous material is at least slightly liquidphilic (e.g., hydrophilic), i.e. having a contact angle of less than 90° to the immersion liquid, e.g. water.

Many other types of liquid supply system are possible. An embodiment of the present invention is not limited to any particular type of liquid supply system. An embodiment of the present invention may be advantageous for use with a confined immersion system in which the liquid between the final element of the projection system and the substrate is confined, for example, in optimizing the use. However, an embodiment of the invention can be used with any other type of liquid supply system.

The present invention is not limited to an immersion lithographic apparatus. A lithographic apparatus of an embodiment of the present invention may be a dry lithographic apparatus. An embodiment of the present invention can be used with a lithographic apparatus that does not comprise a liquid handling structure. The type of lithographic apparatus in which an embodiment of the present invention may be implemented is not particularly limited.

The illumination system IL may comprise an objective optical element (e.g., an objective lens). The objective optical element, also termed objective, is expensive and is not easily exchangeable. As a result, it is advantageous to keep the objective clean to ensure it functions properly.

A system for protecting the objective of the illumination system involves creating an overpressure in the area around the patterning device MA. The purpose of the overpressure is to substantially prevent external gas from reaching the objective by purging the area. The external gas may be a dirty gas (i.e. a gas with a contaminating compound). The external gas may be clean gas but may have one or more different properties to the gas in the region adjacent to the objective. The gas in the region adjacent to the objective may be ultra-high purity (UHP) grade clean gas, for example extremely clean dry air (XCDA®). The external gas may be non-UHP gas. The overpressure and outward flow are designed to form a protection environment by keeping contaminants outside of the protection environment. A problem of this system is that a very large amount of clean gas may be needed to create enough pressure.

The protection environment performance may be adversely affected by relatively high scan speeds of the support structure MT (e.g. reticle table or stage). The relative speed and/or acceleration of the support structure with respect to the objective results in a higher overpressure being needed to form the protection environment. Additionally or alternatively, there may be a limited available flow to be used for the protection environment. Hence, the higher scan speeds and/or the reduction of protection environment supply flow may result in a protection environment that unsatisfactorily protects the objective from contaminants. The extent of the problem varies depending on the type of lithographic apparatus.

The protection environment outflow velocity in the direction in which the support structure MT is scanning may be too low. This causes more contaminants reaching the component that is to be protected. The cause may be direct in that more contaminants contained in contaminated gas are able to enter the protection environment whereupon the contaminants may come into contact with the component. Additionally or alternatively, the cause may be indirect in that a gas flow directed to another part of the lithographic apparatus (contaminated or otherwise) may disrupt a part that is designed to partially protect the component (e.g. a purge hood that provides laminar flow across a surface of the final element of the projection system).

This results in the objective of the illumination system IL, for example, becoming contaminated. The source of this contamination may be particulate, organic or chemical (i.e. inorganic) compounds in the gas to which the objective of the illumination system IL and an optical element of the projection system PS are exposed. This contamination may adversely affect the radiation beam. This may result in defects in the patterned image. It is desirable to reduce the defects in the patterned image.

One possibility to improve the protection environment performance is to reduce gaps between different parts of the protection environment hardware. The purpose of this is to maintain a higher overpressure by reducing leaks from the protection environment. In practice, this may be difficult to implement and may require a substantial redesign of the lithographic apparatus.

An embodiment of the present invention provides a lithographic apparatus with an improved performance for protection of a component of the lithographic apparatus. An embodiment of the present invention may be applied to the protection of any component of the lithographic apparatus that is exposed to a gas.

In a lithographic apparatus according to an embodiment of the invention, an illumination system IL conditions a radiation beam. The illumination system IL comprises optics. The conditioned radiation beam is patterned by a patterning device MA. The patterned radiation beam is directed by a projection system PS to a substrate W. The projection system PS comprises optics. The component may be an optical component. The component 61 may be the top optical element of the projection system PS, the final optical element of the projection system PS, the patterning device MA, or the objective of the illumination system IL, for example.

Figure 6:
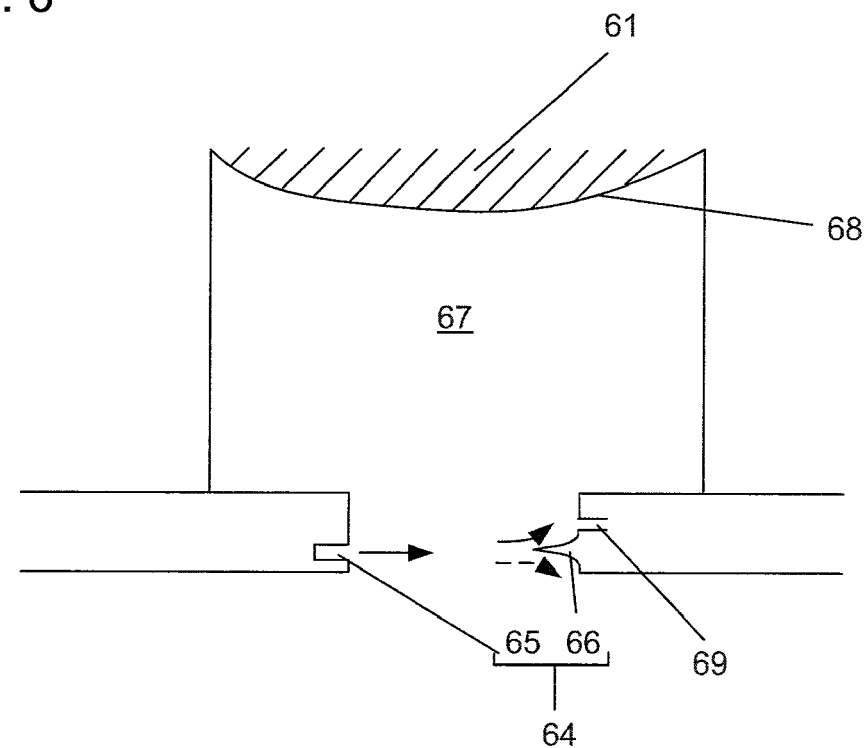
FIG. 6 depicts a component, protection environment and protector according to an embodiment of the invention.

FIG. 6 depicts an embodiment of the invention. A component 61 of the lithographic apparatus has a surface 68 in contact with a protection gas. The surface 68 of the component may be termed a protected surface 68. The purpose of the protection gas is to protect the component 61 from contaminants, for example particulate, organic or chemical (i.e. inorganic) compounds in the external gas (or contaminated gas). The functionality of the protection gas includes helping to ensure the lifetime of the component 61.

The protection gas may be in fluid communication with a gas in another section of the lithographic apparatus. The protection gas may form a protection environment 67. The protection environment 67 is formed adjacent to the surface 68 of the component 61 of the lithographic apparatus. The protection environment 67 is on the same side of the gas flow of the protector 64 as the protected surface 68 of the component 61. The protection environment 67 may be termed a micro environment.

The protection environment 67 may be an ultra-clean gas environment. The protection environment 67 may reduce the cleanable contamination and/or the non-cleanable contamination of the component 61. If the component 61 is an optical component, the degradation in uniformity and stray radiation of the radiation beam may be directly reduced by the increased cleanliness of the component 61.

A protector 64 comprises at least one opening 65 at a boundary of the protection environment 67. The protector may be a purge screen or a protective purge curtain, for example. The opening 65 is configured to direct a gas flow to a surface other than the protected surface 68. The gas flow is directed along a path noncontiguous to the protected surface 68. Desirably, any flow of gas in a region between the gas flow of the protector 64 and the protected surface 68 is substantially nonparallel to the gas flow of the protector 64.

In contrast to the gas flow of the protector 64 according to an embodiment of the invention, a purge flow adjacent to the protected surface 68 is directed along a path contiguous to the protected surface 68. The section of the purge flow that is furthest from the protected surface 68 may not itself come into contact with the surface. However, that section is part of the purge flow that is contiguous to the protected surface 68. In a region between the protected surface 68 and the section of the purge flow furthest from the protected surface 68, a section of the purge flow is parallel to the section of the purge flow that does not come into contact with the protected surface 68. This is different from an embodiment of the present invention according to which there is a region between the gas flow of the protector 64 and the protected surface 68 in which gas flow is nonparallel to the gas flow of the protector 64.

In an embodiment, the gas of the gas flow of the protector 64 is redirected by, for example, a flow divider 66. After contacting the flow divider 66, the gas may flow in the region between the gas flow of the protector 64 and the protected surface 68. In this case the flow of redirected gas is nonparallel (e.g. anti-parallel) to the gas flow of the protector 64.

The gas flow substantially prevents gas from reaching a same side of the gas flow as the protected surface 68 from an opposite side of the gas flow. The gas flow may prevent gas outside the protection environment 67 from reaching inside the protection environment 67.

In FIGS. 6 to 12, broken arrow lines represent a flow of gas (which may be contaminated) from which the surface 68 of the component 61 is protected. Unbroken arrows represent the gas flow of the protector 64 from the opening 65.

According to the overpressure outflow system described above, the opening that supplies the outflow of gas is not at the boundary of the protection environment. Instead, the opening is inside the protection environment. In contrast, the opening 65 of the protector 64 of an embodiment of the invention is at a boundary of the protection environment 67. The gas flow supplied by the opening 65 defines a boundary of the protection environment 67.

An embodiment of the invention substantially prevents external gas from reaching the relevant component 61 without the need for increasing flows. This may be achieved directly by the protector 64 blocking a flow of external gas from reaching the surface 68 of the component 61. Alternatively or additionally this may be achieved indirectly by the protector 64 blocking a flow of gas (clean or dirty) from reaching a purge hood configured to purge the surface 68 of the component 61. A merit of the invention is that it is relatively cheap to implement.

The opening 65 is connected to an overpressure source. Desirably, the protection environment 67 that the component 61 contacts is maintained at an overpressure with respect to the environment outside of the protection environment 67.

The opening 65 may be configured to provide a planar flow of gas. The planar flow may take the form of a gas curtain or a gas screen, for example. The planar gas flow blocks contaminant particulate, organic or chemical (i.e. inorganic) compounds and/or any gas flow external to the protection environment 67 from entering the protection environment 67. A planar gas flow acts as a wall, blocking contaminants that may otherwise enter the protection environment 67.

Alternatively, the opening 65 may be configured to provide a gas flow that extends in a cone shape, for example, from the opening 65. Such a gas flow may be used in the case that the external gas flow from which the component 61 is to be protected is relatively narrow, for example narrower than the gas flow provided by the protector 64. This may be the case if there is a narrow channel leading to the component 61. External gas that flows along the channel in the direction of the component 61 may be blocked by a gas flow that takes the form of a cone shape. Other non-planar shapes of gas flow are possible.

Desirably, the gas flow is substantially perpendicular to a direction of a gas flow that is to be prevented from entering the protection environment 67. Alternatively, the gas flow may not be perpendicular to the direction of the gas flow external to the protection environment 67 but may be at an oblique angle. The gas flow provided by the protector 64 defines a boundary of the protection environment 67. This is distinct from an overpressure outflow system in which the gas flow itself forms the protective environment.

The gas flow provided by the protector 64 is configured to be at an angle to an external gas flow and to have a flow velocity sufficient to block the external gas flow. The flow rate of the gas flow provided by the protector may be reduced compared to a system in which an overpressure causes an outflow to form a protection environment. The flow rate of the protector 64 may be below 100 liters per minute. Desirably, the flow rate is less than 80 liters per minute, less than 60 liters per minute or less than 50 liters per minute.

The opening 65 may be configured to direct a gas flow perpendicular to a surface in which the opening is disposed. The purpose of this is to prevent the gas flow from allowing an external gas flow from passing the gas flow from the opening 65. This may happen if the direction of the gas flow from the opening 65 is at an angle of less than 90 degrees to the direction of the external gas flow. The gas flow from the opening may be at an oblique angle to the surface in which the opening 65 is disposed. In this case, it is desirable that the gas flow from the opening 65 has a velocity component in a direction opposite to the direction of the external gas flow. The purpose of this is to effectively block the external gas flow.

The opening 65 may be configured to direct a gas flow along a path perpendicular to the surface to which it is directed (i.e. the surface other than the protected surface 68). As above, the purpose of this is to prevent external gas flow from reaching the relevant component 61, e.g. optics.

The protection gas may be provided by the gas flow from the opening 65. The gas flow may circulate in the protection environment 67. The gas flow forms the protection gas. Initially, the gas flow is noncontiguous to the protected surface 68. The gas flow is directed along a path distal from the surface 68. After the gas flow contacts the surface other than the protected surface 68 (e.g. in one variation the gas flow contacts a flow divider 66), the gas flow may subsequently contact the protected surface 68.

In an embodiment, an entire surface of the component 61 is on only one side of the gas flow. The component 61 has no surface that is in contact with gas on the side of the gas flow of the protector 64 opposite to the side on which the protected surface 68 of the component 61 is.

The opening 65 may be elongate. The elongate opening 65 may be particularly suited to providing a planar gas flow. However, the elongate opening 65 may provide a gas flow that is not planar. The direction of elongation may be substantially parallel to a surface 68 of the component 61 that is in contact with the protection environment 67. Desirably, the direction of elongation is substantially perpendicular to the direction of relative movement between a moving part 81 (e.g. support structure MT or substrate table WT) and the component 61. The direction of elongation may be substantially parallel to the direction of relative movement. The direction of elongation may be at an oblique angle to the direction of relative movement.

The protector 64 may be positioned between the component 61 and a part 81 (shown in FIGS. 8 and 9) that moves relative to the component 61. The moving part 81 may be a support structure. For example, the moving part 81 may be a support structure MT to support a patterning device MA, or a substrate table WT (i.e. a support structure) to support a substrate W.

The protector 64 may comprise a plurality of openings. Each of the openings may have the features described above in relation to opening 65. The plurality of openings may be arranged such that the plurality of openings provides a planar gas flow. The openings may individually provide a gas flow that is not planar, but when arranged as an array, the resultant gas flow of the array is planar. The array of openings may provide a gas flow that forms a boundary of the protection environment 67.

The openings may be arranged such that each opening, or a subset of the openings, provides a gas flow configured to block a gas flow external to the protection environment 67 from reaching to within the protection environment 67. The openings may provide a plurality of gas flows that each form a barrier to entry to the protection environment 67. Each barrier corresponds to a gas flow that may be provided by one opening, or by a plurality of openings. The barriers may be in the same direction (e.g. all parallel or perpendicular to the surface 68 of the component 61). The barriers formed by the plurality of openings may have different orientations. For example, there may be two barriers that are perpendicular to the surface 68 and one barrier that is parallel to the surface 68.

The protector 64 may comprise a double gas knife. The purpose of this is to add an extra layer of protection. Any contaminants that reach the same side of the first gas flow as the component being protected are blocked by the second gas flow. In an embodiment, one of the openings is closer to the component 61 than the other. The openings may be configured to supply substantially parallel gas flows.

FIG. 6 depicts that the opening 65 is configured to provide a gas flow that is substantially parallel to a surface 68 of the component 61 that is in contact with the protection environment 67. Alternatively, the opening 65 may be configured to provide a gas flow that is substantially perpendicular, or at an oblique angle, to the surface 68 of the component 61. A gas flow that is perpendicular to the surface 68 of the component 61 may be particularly desirable if the surface 68 of the component 61 opposes a surface of a part of the lithographic apparatus.

Figure 11:
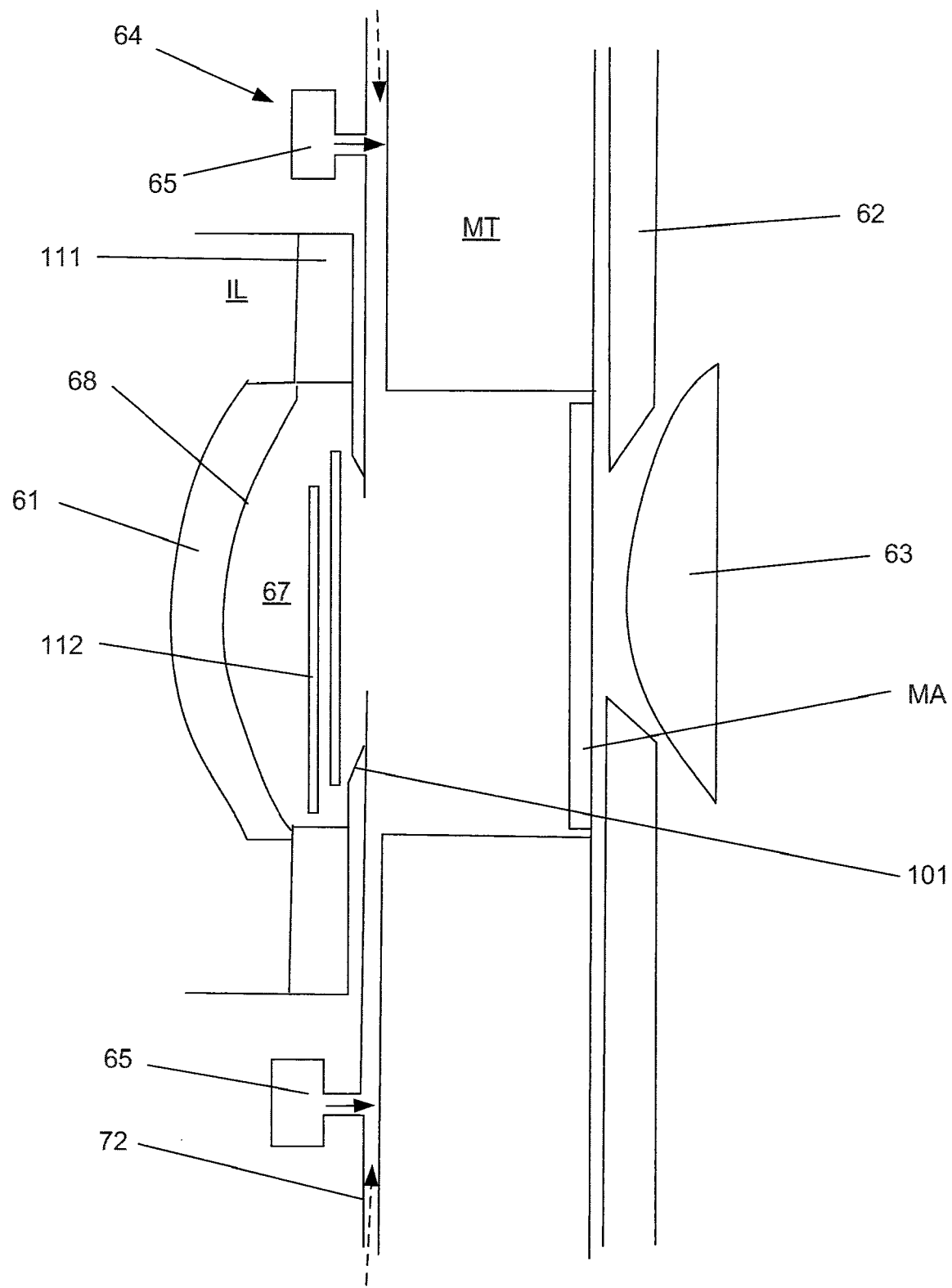
FIG. 11 depicts, in cross section, a lithographic apparatus according to an embodiment of the invention.

As may be seen from FIG. 11, the surface of the part 81, MT opposite the surface 68 of the component 61 may form a boundary of the protection environment 67. External gas may flow towards the component 61 through a channel between the surface 68 of the component and the opposite surface of another part of the apparatus. In this case, the flow of external gas may travel towards the component 61 in a direction substantially parallel to the surface 68 of the component 61. A gas flow provided by the opening 65 of the protector 64 that is perpendicular to the facing surface 68 of the component is substantially perpendicular to the flow of external gas. The protector 64 provides a gas flow that acts as a wall blocking the external gas flow.

Figure 13:
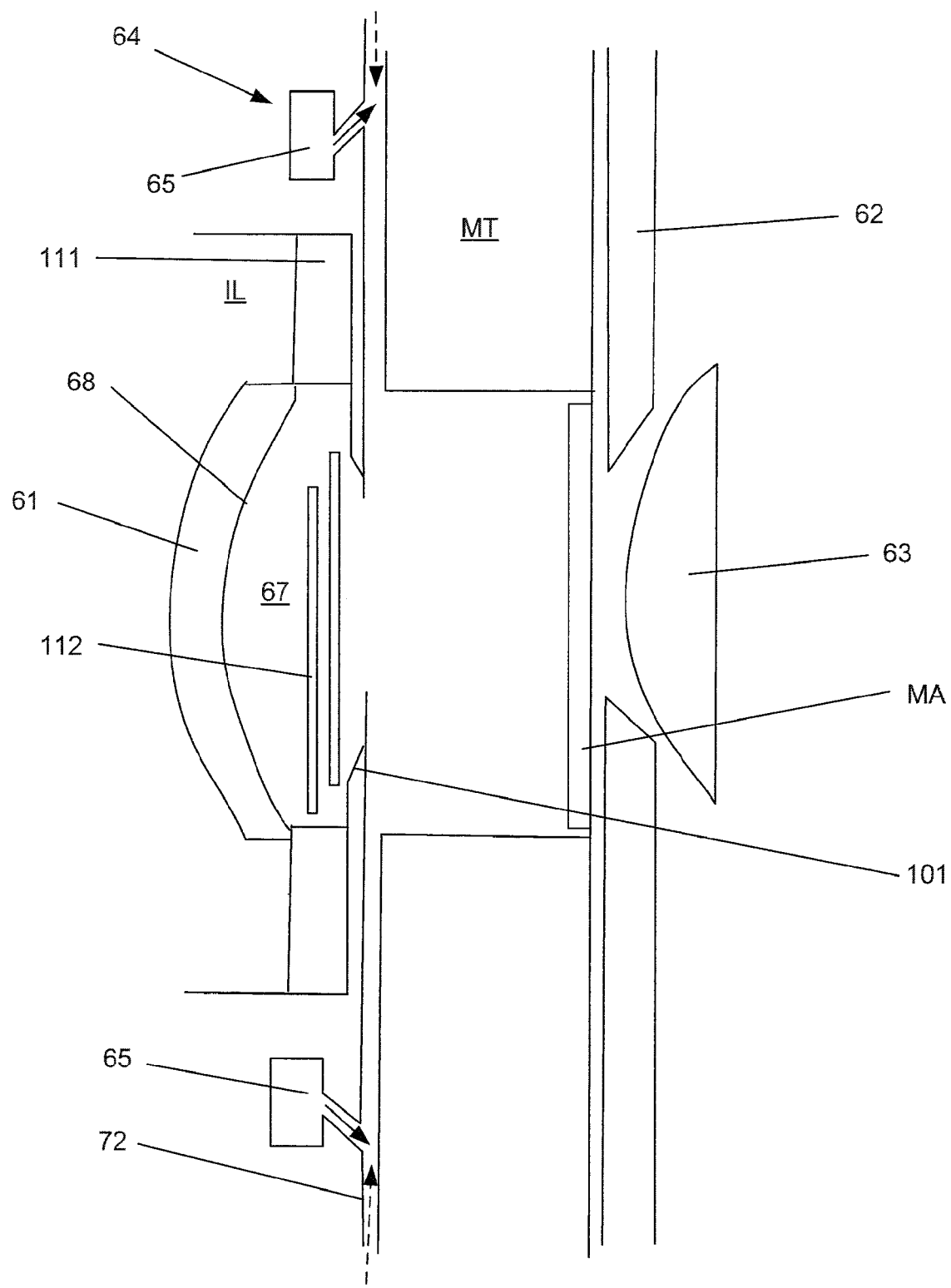
FIG. 13 depicts, in cross section, a lithographic apparatus according to an embodiment of the invention.

FIG. 13 depicts an embodiment of the invention in which the opening 65 is configured to provide a gas flow that has a velocity component in a direction parallel to the surface 68 of the component and away from the component 61. The surface 68 of the component 61 defines an axis that extends perpendicular to the surface 68. In an embodiment the opening 65 is configured to supply a gas flow having a velocity component in a direction away from the axis. The gas flow of the protector 64 is directed outwards in the opposite direction of the incoming external gas flow.

By directing the gas flow of protector 64 partially in a direction opposite to the external gas flow, the gas flow of the protector 64 has greater momentum against the external gas flow. The gas flow of the protector provides greater resistance to the external gas flow. Additionally, the gas of the gas flow of the protector 64 is prevented from being redirected towards the protection environment 67 in which the gas could negatively affect a component of the lithographic apparatus.

FIG. 6 depicts that the opening 65 faces in a direction that is parallel to the surface 68 of the component 61. In an embodiment, the opening 65 is configured to face in a direction substantially perpendicular, or at an oblique angle, to the surface 68 of the component 61. The direction of gas flow provided by the opening 65 of the protector 64 may be independent of the direction in which the opening 65 faces. This is because the coanda effect may be used to redirect the gas flow.

Figure 7:
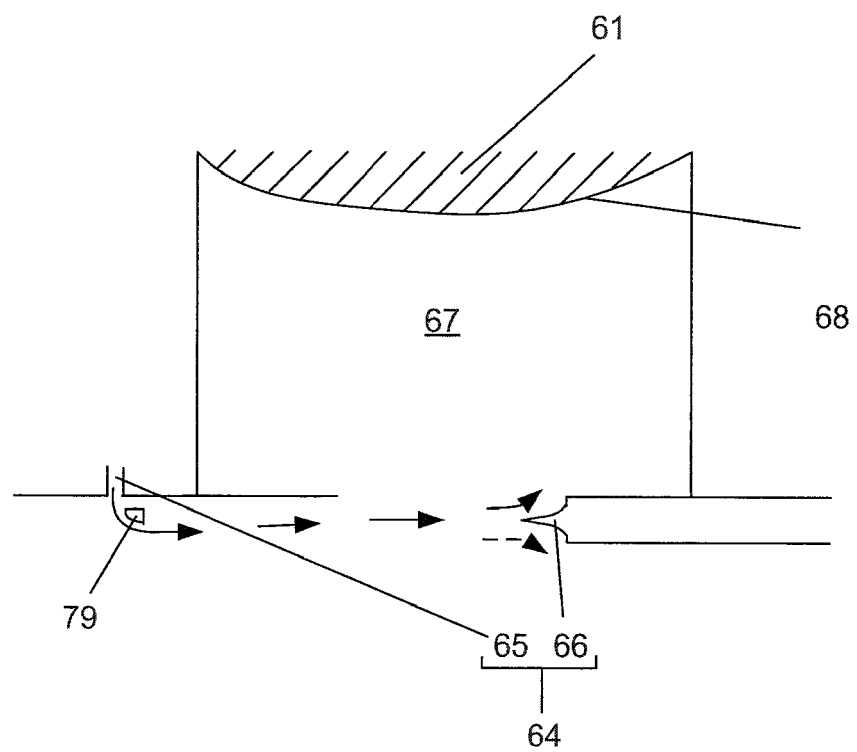
FIG. 7 depicts an embodiment of the invention.

FIG. 7 schematically depicts a protector 64 as described above in relation to FIG. 6, but with a director 79 configured to direct the gas flow provided by the opening 65. The director 79 is the tool through which the coanda effect is used. The director 79 may be positioned just to one side of the direction in which the opening 65 faces. The gas flow is provided by the opening 65 of the protector 64. The gas flow is attracted by an outer surface of the director 79. The gas flow bends around the outer surface of the director 79. The director 79 may be desirable if the lithographic apparatus has very limited space for the protector 64. By using the director, the position of the opening 65 of the protector 64 is less constrained. This allows the opening 65 to be positioned in a place where there is sufficient space while the director 79 may be used to ensure that the gas flow provided by the opening 65 has the desired direction and/or orientation.

The protector 64 may comprise a flow divider 66. The flow divider 66 is configured to direct gas flow provided by the opening 65 of the protector 64 into the protection environment 67. The flow divider 66 is configured to direct external gas flow away from the protection environment 67. At the boundary of the protection environment defined by the gas flow provided by the opening 65 of the protector 64, external gas flow is kept from entering inside the protection environment 67. The external gas may be present just outside the protection environment 67. The flow divider 66 is configured to separate the gas flow provided by the protector 64 and the external gas outside the protection environment 67.

The flow divider 66 may be a fin configured to direct the "dirty" flow down and keep refreshing the area above the protector 64, or purge screen. This has the effect of purging the relevant component, e.g., optical surface 68. The clean gas circulates within the protection environment 67 of the component 61. The external gas is blocked from reaching the component 61. The flow divider 66 may comprise a protrusion having an acute angle pointing in a direction opposite to the direction of the gas flow provided by the protector 64. The flow divider 66 may take the form of an acute ridge pointing in a direction opposite to the direction of the gas flow provided by the protector 64. The ridge form is particularly desirable when the gas flow provided by the protector 64 is planar.

Figure 8:
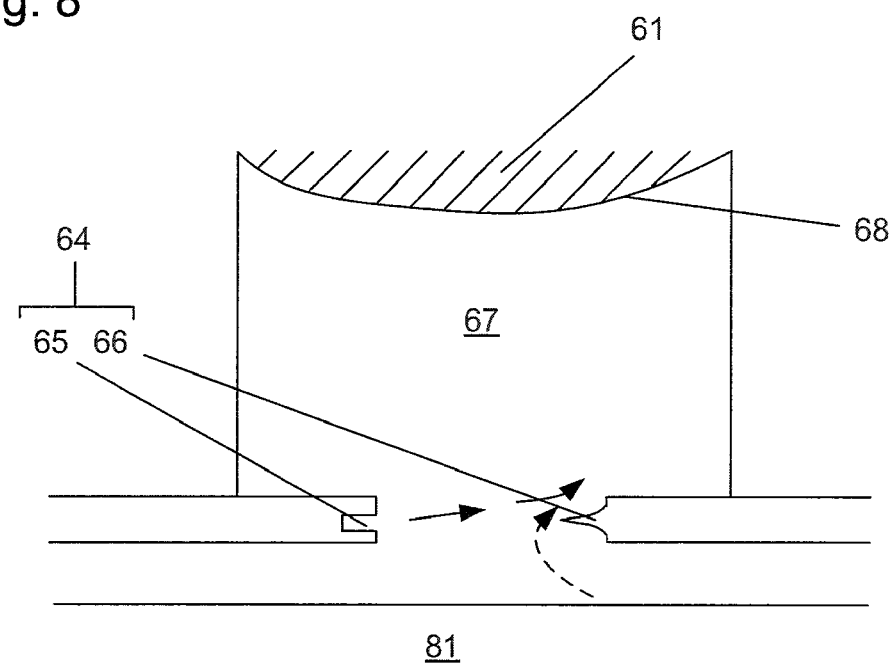
FIG. 8 depicts an arrangement of a protector of an embodiment of the invention.

FIG. 8 depicts an arrangement in which external gas may undesirably enter the protection environment 67. If the gas flow provided by the opening 65 of the protector 64 is directed to a position between the flow divider 66 and the component 61, then external gas positioned just outside of the protection environment 67 may enter the protection environment 67. This is undesirable. This may be a problem in the case that external gas flows in a direction substantially parallel to the gas curtain (i.e. the gas flow provided by the protector 64).

Figure 9:
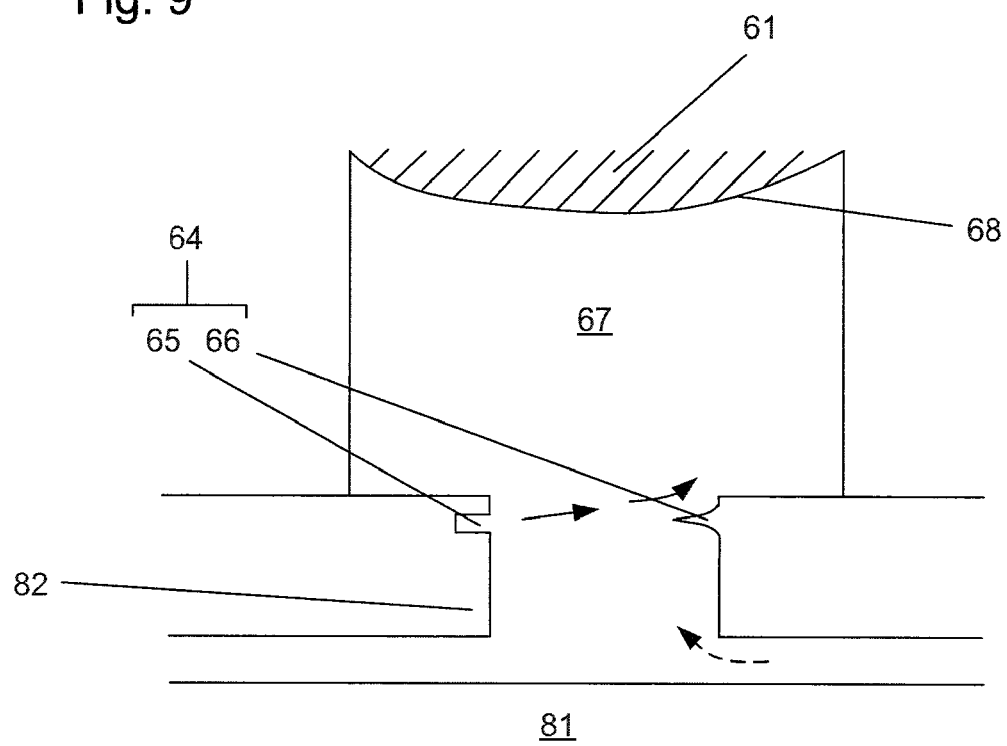
FIG. 9 depicts an arrangement of a protector of an embodiment of the invention.

FIG. 9 depicts an embodiment in which the protector 64 is configured to provide a gas curtain at a position that is separate from the external gas flow. In the embodiment depicted in FIG. 9, the (high velocity) external gas flow outside the protection environment does not come into direct contact with the gas curtain. The external gas outside the protection environment 67 that is in direct contact with the gas curtain has a low velocity component in the direction of the gas flow of the gas curtain. In order to separate the gas curtain from the external gas flow, there may be at least one flange 82 positioned on the opposite side of the opening 65 from the component 61. The flange is configured to block gas flow that is substantially parallel to the gas curtain from coming into contact with the gas curtain. The flange 82 may be elongate in the same direction of elongation of the opening 65 (in the case that the opening 65 is elongate). The flange 82 protects a space in which there is substantially no gas flow that is substantially parallel to the gas curtain. The protector 64 is positioned distal from the moving part 81.

If the gas flow provided by the opening 65 of the protector 64 is directed to a position on the opposite side of the flow divider 66 from the component 61, then gas inside of the protection environment 67 may exit the protection environment 67. This tends towards the creation of an underpressure inside the protection environment.

In an embodiment, the gas flow of the protector 64 is distinct from the protection gas. The gas flow may be extracted by an extractor 69. The protector 64 may comprise at least one extractor 69 configured to extract gas. The extractor 69 is configured to extract the gas that is provided by the opening 65 of the protector 64. The extractor 69 comprises at least one opening connected to an underpressure source. Desirably, the extractor 69 comprises an array of openings. Having an array of openings helps to homogenize the extraction.

The extractor 69 may be positioned to face the gas curtain. The extractor 69 may be positioned at the other side of the optical axis of the surface 68 of the component 61 from the opening 65. Positioning the extractor 69 to face the opening 65 allows the gas of the gas curtain to be extracted directly. The extractor 69 may be configured to help to direct the gas curtain such that the gas curtain has a desirable orientation. The extractor 69 does not have to be positioned to face the opening 65. The extractor 69 may be positioned at any surface that may come into contact with the gas of the gas curtain. There may be a plurality of extractors 69.

Figure 14:
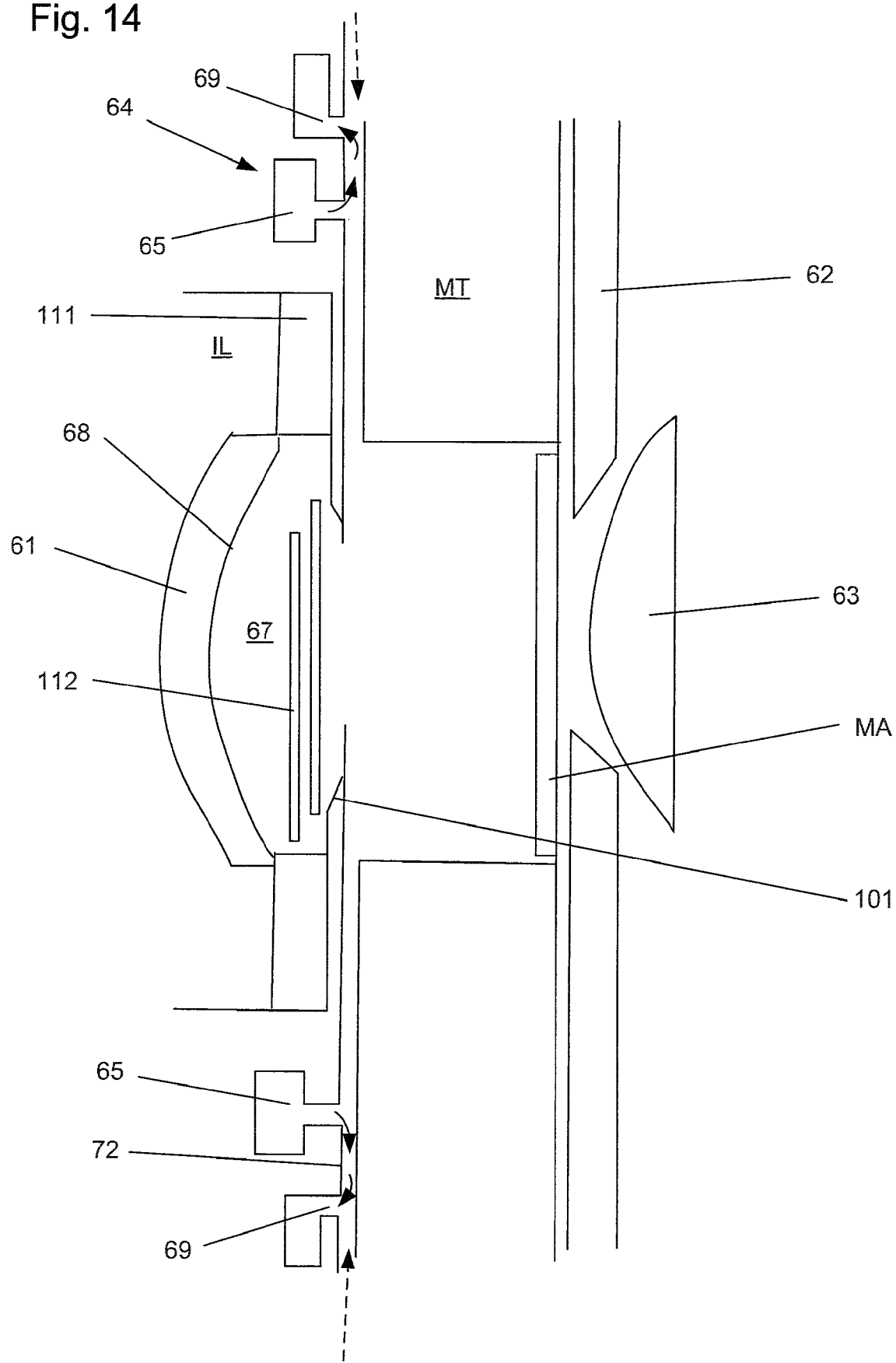
FIG. 14 depicts, in cross section, a lithographic apparatus according to an embodiment of the invention.

FIG. 14 depicts an embodiment in which the extractor 69 does not directly face the opening 65 of the protector 64. The support structure MT moves relative to the opening 65 of the protector 64. This makes it difficult to provide an extractor that always faces the opening 65. Instead, the extractor 69 comprises an opening positioned radially outward of the opening 65 of the protector 64.

Figure 15:
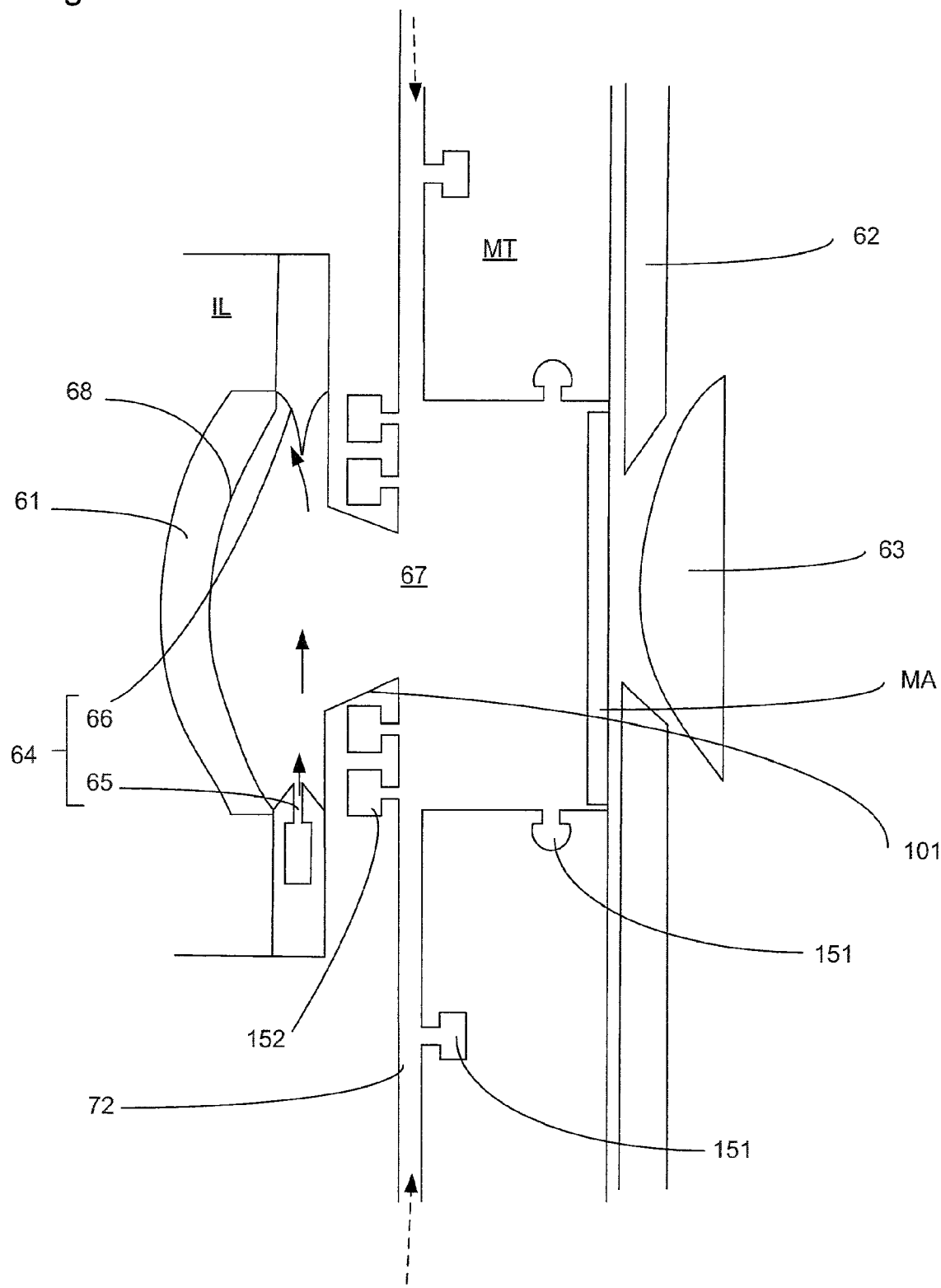
FIG. 15 depicts, in cross section, a lithographic apparatus according to an embodiment of the invention.

FIG. 15 depicts an embodiment comprising a chuck extractor 151 and a purge plate extractor 152. In an embodiment, at least one chuck extractor 151 is provided. The chuck extractor 151 comprises an opening in a surface of the chuck (i.e. the support structure MT). The surface in which the opening is positioned is a surface that faces the protection environment 67. The opening is in fluid communication with an underpressure. In the embodiment depicted in FIG. 15, the protection environment 67 is configured to protect the patterning device (e.g., reticle) MA. The chuck extractor 151 may be used in the context of a protection environment 67 that is configured to protect a different component, such as the objective of the illumination system IL or alike. The chuck extractor 151 may be provided in combination with any of the other features as described herein in the context of any of the embodiments. In an embodiment, a plurality of chuck extractors 151 are provided.

In an embodiment, at least one purge plate extractor 152 is provided. The purge plate extractor 152 comprises an opening in a surface of the purge plate 72. The purge plate 72 is described in more detail elsewhere in this description. The surface in which the opening is positioned is a surface that faces the protection environment 67. The opening is in fluid communication with an underpressure. The purge plate extractor 152 may be provided in combination with any of the other features as described herein in the context of any of the embodiments. In an embodiment, a plurality of purge plate extractors 152 are provided.

The chuck extractor 151 and the purge plate extractor 152 may be provided separately, or in combination with each other. An embodiment may have at least one chuck extractor 151 and no purge plate extractor 152. An embodiment may have at least one purge plate extractor 152 and no chuck extractor 151. An embodiment may have at least one purge plate extractor 152 and at least one chuck extractor 151.

In an embodiment provided with at least one chuck extractor 151, at least one hose is provided. The hose is configured to connect the opening of the chuck extractor 151, which is positioned in the support structure MT, to an underpressure. The at least one hose may undesirably increase resistance to the movement of the support structure MT when the support structure MT moves. For this reason, a purge plate extractor 152 may be more desirable than a chuck extractor 151. This is because a purge plate extractor 151 does not require a hose connected to the support structure MT.

One of the purposes of the extractor 69, the chuck extractor 151 and the purge plate extractor 152 is to reduce the gas pressure in the protection environment 67. For example, in the context of the embodiment depicted in FIG. 15, the chuck extractor 151 and the purge plate extractor 152 reduce the gas pressure in the region above the patterning device MA. Advantages of reduction of the gas pressure in this region are several. Firstly, the reduction reduces the possibility of instability of the aerial image (i.e. the pattern of radiation) caused by gas flows that have been conditioned to have different temperatures mixing with one another. Further, an encoding grid that may be used to accurately position the support structure MT is less disrupted by the gas flow out of the protection environment 67. If the gas flow outwards from the protection environment 67 is relatively high, then that gas flow, and in particular gas flow between a gas flushing system 62 (explained in further detail below) for the first optical element (e.g., lens) 63 of the projection system PS and the support structure MT can undesirably influence an encoding grid.

By using the extractor 69 and/or the chuck extractor 151 and/or the purge plate extractor 152, the flow rate of gas being input into the protection environment 67 by the opening 65 of the protector 64 can be maintained at a relatively high level without the lithographic apparatus suffering from a potential adverse effect of a high gas flow mentioned above. In particular, a transmission image sensor (not shown) can be adversely affected by high gas flow. The transmission image sensor is configured to measure the position of a patterning device pattern on the substrate W.

A relatively high gas flow is desirable because it improves the effectiveness of the protector 64. As depicted in FIG. 15, the protection environment 67 is partly confined by the support structure MT. The gas flowing outwards from the protection environment 67 flows beyond the boundary of the support structure MT, when viewed in plan. The speed of gas flowing outwards from the protection environment 67 is roughly equal for gas flowing outwards in the scanning direction or in the direction perpendicular to the scanning direction.

During a scanning operation, the support structure MT moves in the scanning direction. A low-pressure region forms in the wake of the support structure MT. As a result, surrounding gas flows into the low-pressure region. When the direction of movement of the support structure MT reverses, then the gas that flowed into the low-pressure region may undesirably enter the protection environment 67. This undesirable effect is more likely to occur the greater the ratio of the scanning speed to the speed of gas outflow from the protection environment 67.

Figure 16:
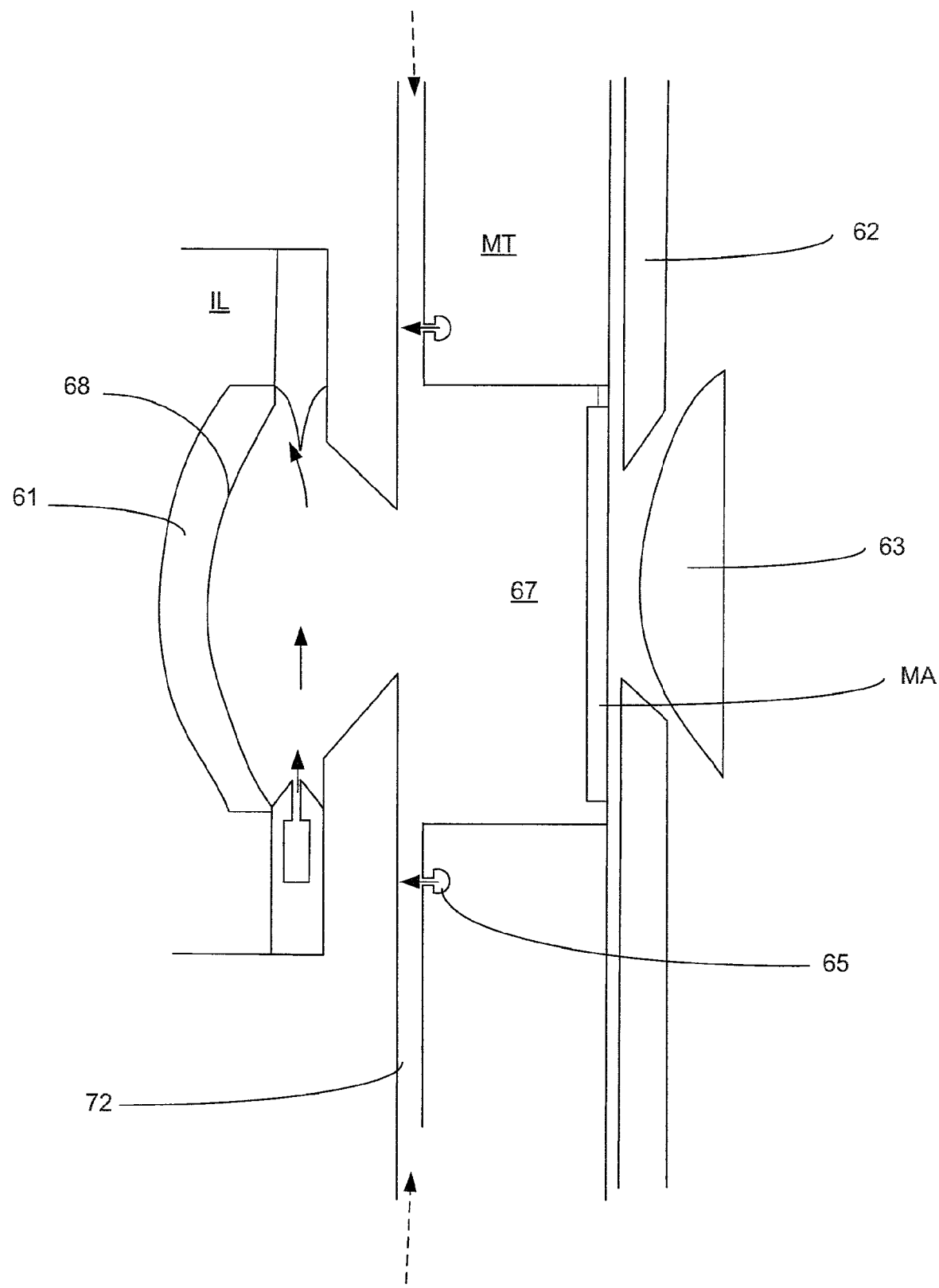
FIG. 16 depicts, in cross section, a lithographic apparatus according to an embodiment of the invention.

FIG. 16 depicts an embodiment in which the opening 65 of the protector 64 is in the support structure MT of a lithographic apparatus. The flow of gas from the opening 65 in the support structure MT is directed towards the purge plate 72. The protector 64 provides a vertical gas curtain towards the purge plate 72 from the support structure MT. The vertical gas curtain forms an enclosed protection environment 67 between the support structure MT and the purge plate 72. The upward flow of gas is opposed by the purge plate 72 regardless of the position of the support structure MT, which changes during a scanning operation. The gas knife that is the gas curtain formed by the protector 64 moves with the support structure MT during a scanning operation. The purpose of this is to help ensure that the patterning device MA is protected at all times during a scanning procedure.

In an embodiment depicted in FIG. 11, the opening 65 of the protector 64 may be in the purge plate 72. In this case, the protector 64 purges gas from the purge plate 72 towards the support structure MT. In an embodiment the opening 65 in the purge plate 72 is elongated. In an embodiment, the length of the opening 65 in the scanning direction is greater than the scanning range of the support structure MT. The purpose of this is to help ensure that the patterning device MA is fully protected throughout the scanning operation. The patterning device MA remains within the protection environment 67 during the whole scanning operation.

As mentioned above, the gas curtain defines a boundary of the protection environment 67. In an embodiment the protection environment 67 is not completely sealed by one or more gas curtains. The purpose of the gas curtain is to provide a block to help prevent a flow of external gas from entering the protection environment 67. The gas curtain helps prevent external gas from approaching the component 61. In an embodiment there may be two gas curtains configured to block external gas flow that may otherwise approach the component 61 in two directions. Apart from the one or two gas curtains, the protection environment 67 may not have a gas curtain at its other boundaries. This is because in a lithographic apparatus the directions in which an external gas flow may approach the component 67 may be limited. In this case it may be sufficient to block external gas flow from those directions. The possibility of external gas approaching from other directions may be sufficiently low that it is not necessary to provide a gas curtain at the boundaries of the protection environment that face in those safe directions. In an embodiment, the protection environment 67 is completely sealed by a plurality of gas curtains.

Figure 10:
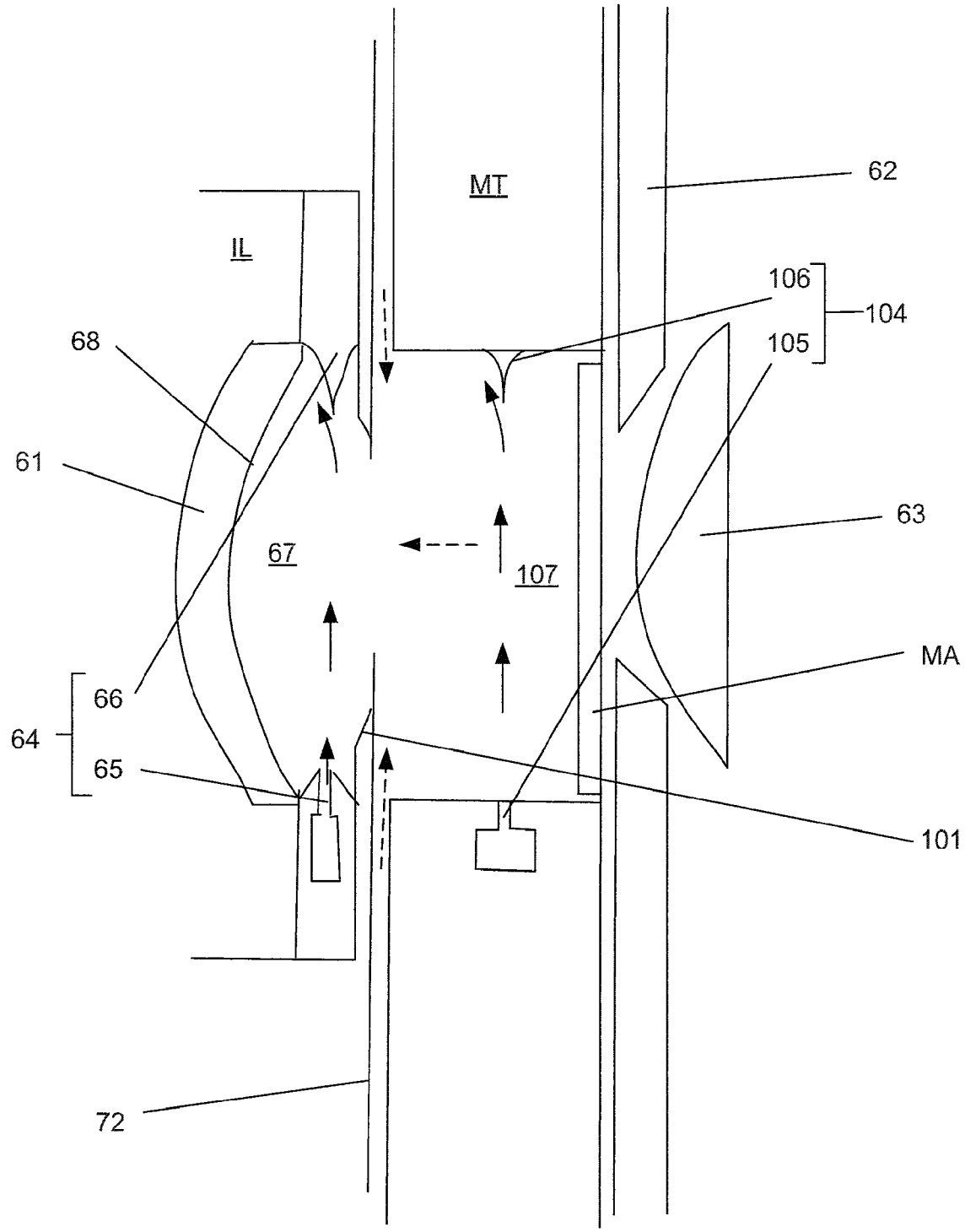
FIG. 10 depicts in cross section, a lithographic apparatus according to an embodiment of the invention.

In FIGS. 10 and 11, the component 61 is an objective of the illumination system IL. The present invention is not limited to the protection of the objective 61. An embodiment of the present invention may be used to protect other components, optical or otherwise. For example, in an embodiment, the protector is employed to protect, or purge, the patterning device MA. In an embodiment the component is the final element of the projection system PS. Features depicted in the Figures labeled by a reference numeral may not be described in the detailed description relating to the Figure. Variations of that feature described elsewhere in the application are applicable to that feature as depicted in other Figures.

FIG. 10 depicts an embodiment of the present invention. The illumination system IL comprises a component 61 that is exposed to gas. The component 61 may be an objective. There may be a support structure MT configured to support a patterning device MA below the illumination system IL. There may be a projection system PS configured to project patterned radiation onto a substrate W below the illumination system IL and below the support structure MT.

The first optic 63 of the projection system may face towards the component 61. The first optic 63 is the first optic through which the patterned radiation beam passes as it travels from the illumination system IL to the substrate W. The first optic 63 may be provided with a gas flushing system 62.

The gas flushing system 62 may be used to purge an exposed surface of an optic 63 (e.g. a lens) of the projection system PS from external gas. The gas flushing system 62 creates a gas flow of clean gas across the surface of the facing optic 63 of the projection system PS.

The gas flow of the gas flushing system 62 comes into contact with the surface of the optic 63 directly from an outlet of the gas flushing system 62, i.e. before coming into contact with another object. The gas flow is in close contact with the surface of the optic 63. The gas flow of the gas flushing system 62 does not form a boundary of a protection environment with which the surface of the optic 63 comes into contact. There is no space between the gas flow of the gas flushing system 62 and the surface of the optic 63. This contrasts with the gas curtain provided by the protector 64. According to an embodiment of the invention, there is a space between the gas curtain and the surface of the component 61 to be protected. The gas curtain defines a boundary of the protection environment.

Two possible sources of the contamination of the component 61 are described below.

Firstly, external gas may flow from an intermediate space between the support structure MT and the illumination system IL to the component 61. The support structure MT is a part of the lithographic apparatus that may or may not move relative to the objective, i.e. the component 61. The support structure MT has a surface that faces the component. The support structure MT for the patterning device MA moves in a scanning direction relative to the illumination system IL. The speed of this relative movement and the relative acceleration may cause gas to move between the support structure MT and the under surface of the illumination system IL. This gas may flow towards the facing surface 68 of the component 61 of the illumination system IL.

Secondly, external gas may reach the component 61 from the direction of the patterning device MA. The clean gas provided by the gas flushing system 62 to purge the optic 63 may move towards the component 61 and become contaminated along the way.

An embodiment of the present invention at least partially overcomes the first source of contamination by providing a protector 64 blocking contaminated flow pushed upwards by, for example, the chuck (i.e. the support structure MT) from reaching the relevant optics, i.e. the component 61. The protector forms a divide perpendicular to the contaminated flow. The divide may take the form of a gas knife or a small slit purge hood. A purge screen that is parallel to the movement of the support structure is established.

The protector 64 may be a gas curtain that separates the component 61 from the first source of the external gas described above. The protector 64 may be configured to separate the component 61 from an intermediate space radially outward of the component 61 between the illumination system IL and the support structure MT. The environment with which the component 61 comes into contact is maintained as a clean environment. According to the embodiment depicted in FIG. 10, the protector 64 is configured to separate the component 61 from the support structure MT. By use of the protector 64, the clean environment is separated from the external environment (which may be contaminated or clean).

As can be seen in FIG. 10, the protector 64 provides a division perpendicular to the optical axis of the illumination system IL. A purge screen is established parallel to the relative movement of the support structure MT and the illumination system IL.

The gas flow of the protector 64 may extend radially outwards between the illumination system IL and the support structure MT. In this way, the gas flow may prevent external gas from reaching a region beneath the component 61. Even if external gas reaches the region directly below the component 61 from the intermediate space, the protector 64 prevents the external gas from reaching the component 61. Furthermore, the protector 64 protects the component 61 from the second source of external gas that comes from the direction of the patterning device MA.

The lithographic apparatus may comprise a purge plate 72 configured to help prevent gas from reaching the protected surface 68. The purge plate is positioned between the component 61 and the support structure MT that moves relative to the component 61. The purge plate 72 is substantially parallel to the surface of the support structure MT that faces the component 61. The purge plate 72 and the upper surface of the support structure MT form the upper and lower boundaries of a narrow space between them. The space between the purge plate 72 and the support structure MT is long and narrow. This arrangement reduces the diffusion of gas along the gap towards the protected surface 68.

The purge plate 72 may be substantially stationary with respect to the component 61. The support structure MT may move relative to the purge plate 72. The opening 65 may be in the purge plate 72. A membrane 101 may be provided to interface the purge plate 72 with the component 61 or to a structure (e.g. illumination system IL) to which the component 61 is fixed. The membrane 101 may be configured to help prevent gas from reaching the protected surface 68 from a region between the purge plate 72 and the illumination system IL.

The membrane 101 may allow relative movement between the component 61 and the purge plate 72. The purge plate may be attached to the same frame as the frame of the support structure MT. The purge plate 72 may be attached to a frame that is different from the frame of the support structure MT.

The purge plate 72 may be provided between the protection environment 67 of the component 61 and the region containing the patterning device MA. The purge plate 72 may be a part of the illumination system IL. The protector 64 may comprise at least one opening 65 in the undersurface of the purge plate 72 configured to provide a gas flow. The purge plate 72 at least partially blocks gas from a region surrounding the illumination system IL from reaching the component 61.

The membrane 101 may be provided to seal a space between the purge plate 72 and the under surface of the illumination system IL. The membrane 101 may be connected to a surface of the purge plate 72. The membrane 101 may form a seal between the purge plate 72 and a surface of the protector 64. The protector may form a part of the illumination system IL. The membrane may form a seal between the purge plate 72 and a purge compartment configured to purge an area adjacent to the component 61. The membrane 101 is configured to block gas from reaching the component 61. The membrane 101 prevents gas that is between the purge plate 72 and the projection system PS from entering the protection environment 67.

FIG. 11 depicts an embodiment of the present invention. The same sources of contaminated flow as described above with respect to FIG. 10 are equally applicable to the embodiment depicted in FIG. 11. For example, external gas flow may be pushed inside the protection environment 67 by, e.g., the chuck (i.e. support structure MT) movement. The protector 64, e.g. purge curtain, helps prevent contaminated flow from reaching the component 61 and patterning device MA. The protector 64 is configured to provide a gas flow perpendicular to the contaminated flow or chuck relative movement direction.

The embodiment of FIG. 11 has many features in common with the embodiment of FIG. 10. Detailed description of those features may be omitted here. The embodiments of those features described with respect to FIG. 10 are applicable to the embodiment of FIG. 11.

The protector 64 is provided to separate the component 61 from the intermediate space between the illumination system IL and the support structure MT radially outward of the component 61. Desirably, the gas in the protection environment 67 of the component 61 is maintained at an overpressure relative to the gas in the region containing the patterning device MA.

The purge plate 72 may be provided between the protection environment 67 of the component 61 and the region containing the patterning device MA. The purge plate 72 may be a part of the illumination system IL. The protector 64 may comprise at least one opening 65 in the undersurface of the purge plate 72 configured to provide a gas flow. In an embodiment, the opening 65 of the protector 64 is provided in the support structure MT.

A purge compartment 111 may be configured to provide a gas flow across a surface 68 of the component 61. The purpose of the purge compartment 111 is to protect the component 61 from contaminants. The effectiveness of the purge compartment 111 may be adversely affected by other gas flows. The protector 64 protects the purge compartment 111 from such unwanted gas flows.

The protector 64 operates in a similar fashion to a gas knife. The opening 65 of the protector 64 may be provided between the support structure MT and the illumination system IL. The opening 65 may be elongate. The elongate opening 65 is connected to an overpressure source and is configured to supply a gas flow. The protector 64 supplies a gas flow that may be directed towards the support structure MT. Alternatively, the gas flow of the protector 64 may be directed away from the support structure MT. Desirably, the gas flow is directed radially outwards with respect to an axis of the component 61, e.g. the optical axis of the objective. The gas flow helps prevent external gas from the intermediate space from reaching the component 61.

By supplying flow to the patterning device compartment above the upper surface of the support structure MT, the gas outside the protection environment 67 is blocked efficiently. The protector 64 prevents clean gas within the protection environment 67 of the component 61 from escaping to the intermediate space. As a result, the clean gas will be redirected. For example, the clean gas may escape the protection environment 67 by passing the patterning device MA and/or the projection system PS. This may additionally improve the cleanliness of other parts of the lithographic apparatus by the purging effect of the redirected clean gas.

Desirably, the protector 64 comprises at least one elongate opening 65 that extends in a direction perpendicular to a scanning direction. In an embodiment, the protector 64 comprises at least two elongate openings 65 extending in a direction perpendicular to the scanning direction. Two elongate openings 65 are positioned on either side of the optical axis of the illumination system IL.

In an embodiment, the protector 64 comprises at least one elongate opening that extends in the scanning direction. In an embodiment, the protector 64 comprises at least two elongate openings extending in the scanning direction and at least two elongate openings 65 extending in a direction perpendicular to the scanning direction. In an embodiment, the protector 64 comprises at least two elongate openings extending in the scanning direction.

The elongate openings 65 extending in a direction perpendicular to the scanning direction are effective to help prevent external gas resulting from relative movement of the support structure MT and the illumination system IL from reaching the component 61. The external gas from the intermediate space resulting from the relative movement of the support structure MT and the component 61 in the scanning direction flows substantially in the scanning direction. The elongate opening 65 is perpendicular to the flow of external gas. The gas flow of the protector 64 acts as a block to the external gas flow.

Any elongate opening 65 that extends in the scanning direction is useful for preventing external gas traveling in a stepping direction, perpendicular to the scanning direction, from reaching the component 61.

Desirably, the protector 64 forms a perimeter radially outward of the objective 61. The loop is formed by at least one elongate opening 65. The loop may be closed or may comprise at least one gap between sections of opening 65 of the optical protector 64. The purpose of the perimeter is to help prevent external gas from reaching the objective 61 from any direction.

At least one optical correction plate 112 may be provided in the protection environment 67. Such an optical correction plate 112 may be used whether the lithographic apparatus is an immersion lithographic apparatus or whether it is a dry lithographic apparatus. The optical correction plate 112 is configured to condition the radiation that has passed through the illumination system IL, for example by at least partially correcting an optical property of the radiation beam. The optical correction plate 112 may be the component 61 that is to be protected. The optical correction plate 112 may serve to at least partially protect the component 61. The optical correction plate 112 may be substantially parallel to a surface 68 of the component 61. The purge compartment 111 may be configured to purge at least one surface of the optical correction plate 112.

A patterning device protector 104 may be used to form a boundary of a patterning device protection environment 107 of the patterning device MA. The patterning device protector 104 may have the same features as described above in relation to the protector 64. The patterning device protector 104 may comprise a patterning device protector opening 105. The patterning device protector 104 may comprise a patterning device flow divider 106. The patterning device protector opening 105 may be provided at a surface of a chuck configured to support the patterning device MA.

Figure 12:
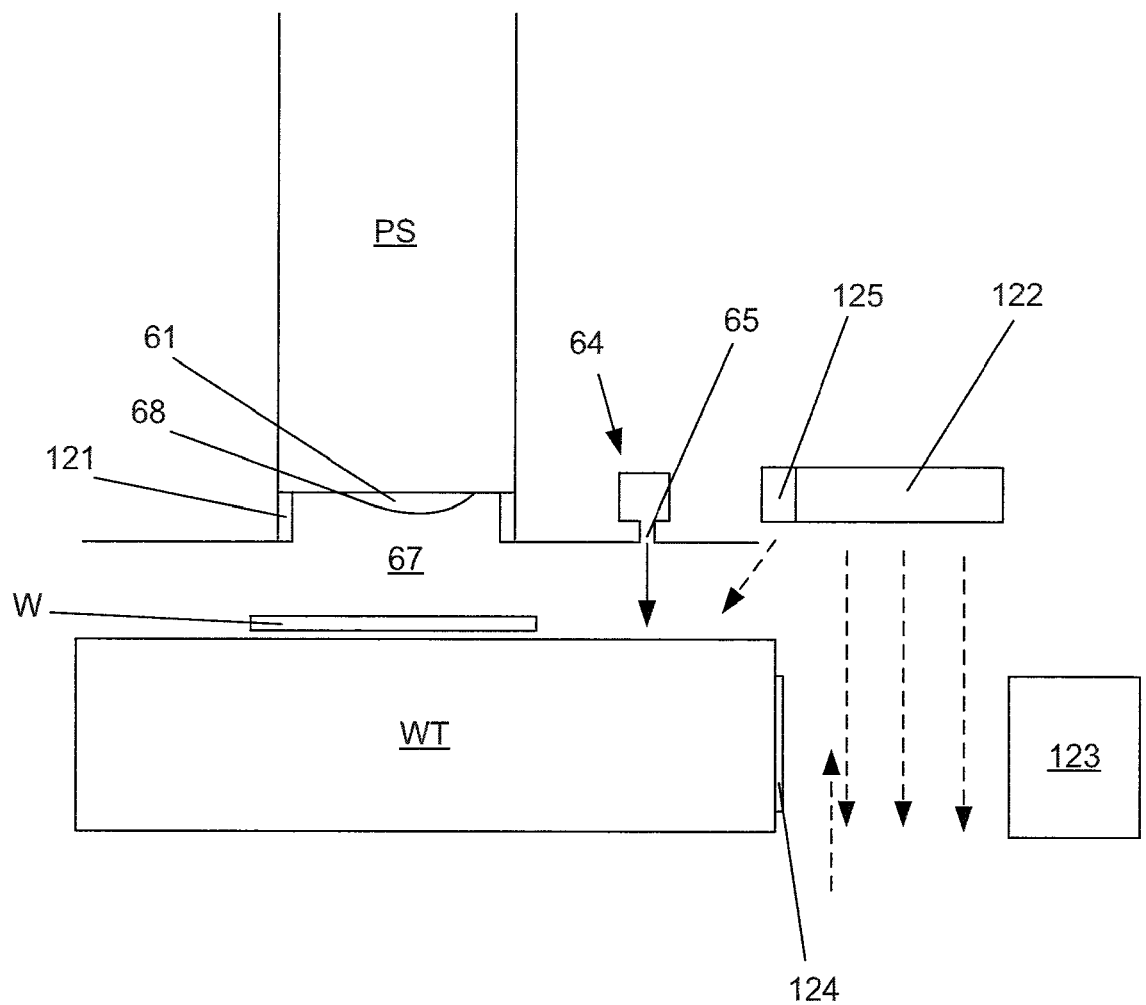
FIG. 12 depicts, in cross section, a lithographic apparatus according to an embodiment of the invention.

FIG. 12 depicts an embodiment of the invention. The protector 64 is used to protect a surface shield 121, and thereby indirectly to protect the surface 68 of the component 61. The surface shield 121 may be a purge hood. The surface shield 121 is configured to direct protection gas along a path contiguous to the protected surface 68 to protect the protected surface 68. The protector 64 comprises at least one opening 65 configured to direct a gas flow distinct from the protection gas. The gas flow helps prevent gas from reaching a same side of the gas flow as the protected surface from an opposite side of the gas flow.

In an embodiment, the surface shield 121 is configured to provide a laminar flow of gas across the protected surface 68. The component 61 may be the final element of the projection system PS.

The projection system PS is configured to project a patterned beam of radiation onto a substrate W. A substrate table WT supports the substrate W. The substrate W and/or the substrate table WT move relative to the component 61. A gas may undesirably flow towards the surface shield 121 through a gap between the projection system PS and the substrate W and/or substrate table WT. The protector 64 provides a gas flow at a boundary of the protection environment 67. The surface shield 121 is within the protection environment 67.

The opening 65 may be an opening in an undersurface of the projection system PS. In an embodiment, the opening 65 of the protector 64 is provided in the substrate table WT. In a similar fashion to the protector 64 as described in relation to FIG. 11, the protector 64 of the embodiment depicted in FIG. 12 blocks a flow of gas. The opening 65 may be elongate. The opening 65 may extend in a direction perpendicular to the scanning direction. Additionally or alternatively, an opening of the protector 64 may extend in a direction parallel to the scanning direction.

A difference between the embodiment of FIG. 11 and the embodiment of FIG. 12 is that the protector 64 of the embodiment of FIG. 11 provides a gas curtain that blocks a channel between the illumination system IL and the support structure MT, whereas the protector 64 of the embodiment of FIG. 12 provides a gas curtain that blocks a channel between the projection system PS and the substrate W and/or substrate table WT. In other respects, the features described above with respect to FIG. 11 may be applied to the embodiment of FIG. 12.

A source of gas that may undesirably affect the performance of the surface shield 121 is a gas blower 122, also termed an air shower. A gas blower 122 may be used in a lithographic apparatus to provide a flow of gas that satisfies certain parameters, such as humidity, temperature and pressure, to a section of the lithographic apparatus.

For example, an interferometer 123 may be used to determine the position of the substrate table WT of the apparatus. The interferometer 123 is configured to provide a laser beam to a surface of the substrate table WT. The determination of the position of the substrate table WT is based on the detection of the reflected laser beam. The laser beam may be reflected by a mirror 124 on a surface of the substrate table WT. The condition of the reflected laser beam may depend on any gas through which it travels between the interferometer 123 and the substrate table WT. In order to keep the effect of the medium through which the laser beam travels consistent, a gas blower 122 may be provided. The gas blower 122 may supply a gas of any kind, i.e. not necessarily air.

The gas blower 122 is positioned on the opposite side of the gas flow of the protector 64 to the component 61. The gas blower 122 is configured to supply a flow of conditioning gas to condition the beams of the interferometer 123. As a side effect, some of the gas from the gas blower 122 may travel towards the component 61 along a gap between a structure (e.g. projection system PS) to which the component 61 is fixed and a structure (e.g. substrate table WT) that moves relative to the component 61. The gas flow of the protector 64 is configured to help prevent the flow of conditioning gas from reaching the same side of the gas flow as the protected surface 68.

The gas blower 122 may be positioned above the interferometer 123. The gas blower may have a fixed position relative to the projection system PS. The gas flow provided by the gas blower 122 for the interferometer 123 may have different parameters from any gas flow provided to any other part of the lithographic apparatus. The purpose of the gas blower 122 is to provide a consistent medium between the substrate table WT and the interferometer 123. The gas blower 122 may provide a flow of gas downwards, away from the projection system PS.

A flow of external gas may flow through the region between the interferometer 123 and the mirror 124. In order to prevent the external gas from traveling along a channel between the projection system PS and the substrate table WT, towards the surface shield 121 and the component 61, a gas seal 125 may be provided. The gas seal 125 may be positioned adjacent to the gas blower 122. The gas seal 125 may be a part of the gas blower 122. The gas seal 125 comprises a flow of gas directed downwards and radially inwards. The purpose of the gas seal 125 is to help prevent external gas from rising against the flow of the gas blower 122 adjacent to the mirror 124. However, the gas seal 125 itself may cause a problem.

Some external gas may be sucked into the space between the substrate table WT and the projection system PS by the gas seal 125. Some external gas may be dragged into the channel between the substrate table WT and the projection system PS by the radially inward gas flow of the gas seal 125. This is particularly the case when the substrate table WT moves relative to the projection system PS. As may be seen in FIG. 12, when the substrate table WT moves to the left in the Figure, external gas may be sucked into the gap between the substrate table WT and the projection system PS. Some external gas passes the gas seal 125 to reach the same side of the gas seal as the protected surface 68 of the component 61.

The gas flow of the gas seal 125 may undesirably disrupt the surface shield 121. The protector 64 blocks the gas flow of the gas seal 125 from entering the protection environment 67.

The gas flows provided to different sections of the apparatus may be intentionally set to satisfy different requirements. It may be undesirable for two gas flows to mix. This is because mixing dilutes the gas of the desired parameters. A gas blower 122 or any other gas flow may contain contaminant particulate, organic or chemical (i.e. inorganic) compounds. It is undesirable for the external gas blower 122 or gas flow to reach a component 61 of the apparatus. A protector 64 of an embodiment of the present invention may be used to help prevent the undesirable mixing of gases provided at different sections of the lithographic apparatus.

Desirably, the gas flow of the protector 64 is comprised of extremely clean dry air (XCDA®). The gas flow of the protector 64 may be of low humidity, e.g. 0%. The gas flow that is to be prevented from entering the protection environment may be of very low humidity, e.g. 0%. The gas flow of the protector 64 may be comprised of extremely clean humidified air (XCHA®), or compressed clean air (CCA). XCHA® and CCA have an advantage of being close to environmental humidity and thus less disturbing for the interferometer beams.

In an embodiment there is provided a lithographic apparatus comprising a protector and a component with a protected surface in contact with a protection gas. The protector comprises at least one opening configured to direct a gas flow to a surface other than the protected surface along a path noncontiguous to the protected surface. The gas flow substantially prevents gas from reaching a same side of the gas flow as the protected surface from an opposite side of the gas flow.

In an embodiment there is provided a lithographic apparatus comprising a component, a surface shield and a protector. The component has a protected surface. The surface shield is configured to direct a flow of protection gas along a path contiguous to the protected surface to protect the protected surface. The protector comprises at least one opening configured to direct a gas flow distinct from the flow of protection gas. The gas flow substantially prevents gas from reaching a same side of the gas flow as the protected surface from an opposite side of the gas flow.

The protection gas may form a protection environment.

The protector may be configured to separate the protected surface from the opposite side of the gas flow. The at least one opening may be configured to direct a gas flow substantially perpendicular to a contaminated flow of gas towards the component.

The protector may be positioned between the protected surface and a part of the lithographic apparatus that is configured to move relative to the component.

In an embodiment the lithographic apparatus may further comprise a structure configured to move relative to the component. The structure may have a surface adjacent and facing the protected surface. The lithographic apparatus may further comprise a purge plate positioned between the structure and the protected surface. The purge plate may be configured to substantially prevent gas from reaching the protected surface. The purge plate may be substantially stationary with respect to the component. The lithographic apparatus may further comprise a membrane configured to interface the purge plate with a structure to which the component is fixed. The membrane may be configured to substantially prevent gas from reaching the protected surface from a region between the purge plate and the membrane. The at least one opening may be in the purge plate. The at least one opening may be in the structure and may be configured to direct a gas flow to a surface of the purge plate. The structure may be a support structure configured to hold a patterning device.

In an embodiment the lithographic apparatus may further comprise a gas blower on a side of the gas flow opposite to the component. The gas blower may be configured to supply a flow of conditioning gas. The gas flow may be configured to substantially prevent the flow of conditioning gas from reaching the same side of the gas flow as the protected surface. The structure to which the component is fixed may be a projection system.

The structure configured to move relative to the component may be a substrate table or a mask table.

The component may be a final optical element of a projection system or an optical element of an illumination system.

Any flow of gas in a region between the gas flow and the protected surface may be nonparallel to the gas flow.

The component may an optical component. The protector may comprise a gas curtain. The gas flow may be distinct from the protection gas.

The protection gas may be provided by the gas flow. The protector may comprise a plurality of openings.

The at least one opening may be configured to supply a planar gas flow. The at least one opening may be elongate. The at least one opening may be configured to direct a gas flow perpendicular to a surface in which the opening is disposed. The at least one opening may be configured to direct a gas flow along a path perpendicular to the surface other than the protected surface.

An entire surface of the component may be on only one side of the gas flow.

The protection gas may be maintained at an overpressure with respect to gas on the opposite side of the gas flow.

The protector may further comprise a flow divider toward which the at least one opening is configured to direct the gas flow. The protector may comprise a flow divider configured to redirect towards the protected surface the gas flow directed by the at least one opening and to redirect external gas away from the protected surface.

The component may be an optical component and the protector may be configured to separate an optical axis of the optical component from a region on the opposite side of the gas flow.

The at least one opening may be configured to direct a gas flow substantially parallel to the protected surface.

The component may be an optical component and the at least one opening may be configured to direct a radially outward gas flow with respect to an optical axis of the optical component. The component may be an optical component and the at least one opening may be configured to direct a gas flow across an optical axis of the optical component.

The at least one opening may be elongate and may extend in a direction substantially perpendicular to a scanning direction. The at least one opening may be elongate and may extend in a direction substantially parallel to a scanning direction.

A length of the at least one opening may be greater than a scanning range of a structure that moves during a scanning operation.

In an embodiment the lithographic apparatus may further comprise an illumination system configured to condition a radiation beam. The component may be an objective of the illumination system. The component may be a patterning device.

In an embodiment the lithographic apparatus may further comprise a projection system configured to project a pattern imparted to a radiation beam by a patterning device onto a substrate. The component may be an optical element of the projection system.

In an embodiment, the lithographic apparatus may further comprise a support structure. The protector may be configured to separate the protected surface from an intermediate space radially outward of the component adjacent a surface of the support structure.

The protector may be configured to separate the protected surface from a support structure.

The component may be an optical component and the protector may comprise at least two elongate openings that extend in a direction substantially perpendicular to a scanning direction with an optical axis of the optical component between the elongate openings.

The component may be an optical component and the protector may comprise a plurality of elongate openings that form a perimeter around an optical axis of the optical component.

In an embodiment, the lithographic apparatus may comprise a projection system and a gas flushing system. The projection system is configured to project a pattern imparted to a radiation beam by a patterning device onto a substrate. The gas flushing system is configured to generate a gas flow across at least a part of a path of the radiation beam.

The at least one opening may be configured to direct a gas flow of clean dry air.

In an embodiment, the lithographic apparatus may further comprise an extractor configured to extract gas provided by the at least one opening of the protector.

In an embodiment, the lithographic apparatus may further comprise a support structure and a support structure extractor. The support structure is constructed to support a patterning device. The support structure extractor is configured to extract gas provided by the at least one opening of the protector. The support structure extractor may comprise an opening in the support structure.

In an embodiment the lithographic apparatus may further comprise a purge plate and a purge plate extractor. The purge plate is configured to substantially prevent gas from reaching the protected surface. The purge plate extractor is configured to extract gas provided by the at least one opening of the protector. The purge plate extractor may comprise an opening in the purge plate.

In an embodiment there is provided a lithographic apparatus comprising an illumination system and a protector. The illumination system has an objective. A protected surface of the objective is in contact with a protection gas. The protector comprises at least one opening configured to direct a gas flow to a surface other than the protected surface along a path noncontiguous to the protected surface. The gas flow substantially prevents gas from reaching a same side of the gas flow as the protected surface from an opposite side of the gas flow.

In an embodiment there is provided a lithographic apparatus comprising a projection system and a protector. The projection system has a lens. A protected surface of the lens is in contact with a protection gas. The protector comprising at least one opening configured to direct a gas flow to a surface other than the protected surface along a path noncontiguous to the protected surface. The gas flow substantially prevents gas from reaching a same side of the gas flow as the protected surface from an opposite side of the gas flow.

The at least one opening may be configured to direct a gas flow between a lower surface of the projection system and an upper surface of a structure configured to move relative to the system.

The at least one opening may be elongate and may extend in a direction perpendicular to a direction of relative movement between the projection system and the structure.

In an embodiment there is provided an illumination system for a lithographic apparatus configured to condition a radiation beam. The illumination system comprises an optical component and a protector. The optical component has a protected surface in contact with a protection gas. The protector comprises at least one opening configured to direct a gas flow to a surface other than the protected surface along a path noncontiguous to the protected surface. The gas flow substantially prevents gas from reaching a same side of the gas flow as the protected surface from an opposite side of the gas flow.

In an embodiment there is provided a projection system for a lithographic apparatus configured to project a patterned radiation beam onto a substrate. The projection system comprising a protector an optical component with a protected surface in contact with a protection gas. The protector comprises at least one opening configured to direct a gas flow to a surface other than the protected surface along a path noncontiguous to the protected surface. The gas flow substantially prevents gas from reaching a same side of the gas flow as the protected surface from an opposite side of the gas flow.

In an embodiment there is provided a method of manufacturing a device using a lithographic apparatus comprising a component with a protected surface in contact with a protection gas. The method comprises directing a gas flow from at least one opening to a surface other than the protected surface along a path noncontiguous to the protected surface. The gas flow substantially prevents gas from reaching a same side of the gas flow as the protected surface from an opposite side of the gas flow.

In an embodiment there is provided a method of manufacturing a device using a lithographic apparatus comprising a component with a protected surface. The method comprises directing a protection gas along a path contiguous to the protected surface to protect the protected surface. The method further comprises directing a gas flow distinct from the protection gas from at least one opening. The gas flow substantially prevents gas from reaching a same side of the gas flow as the protected surface from an opposite side of the gas flow.

As will be appreciated, any of the above described features can be used with any other feature and it is not only those combinations explicitly described which are covered in this application.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components. Throughout the description, reference has been made to a stepping direction and a scanning direction. The scanning and stepping direction as referred to in the description are principal orthogonal axes. While in a preferred embodiment, these principal axes may be aligned with the scanning and stepping directions, in other embodiments they may be independent of the scanning and stepping directions.

While specific embodiments of the invention have been described above, it will be appreciated that the invention may be practiced otherwise than as described. The controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

One or more embodiments of the invention may be applied to any dry lithography apparatus. One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a liquid handling structure) or an outlet out of the immersion space (or an inlet into the liquid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
a component with a protected surface in contact with a protection gas in a protection volume; and
a protector comprising at least one opening configured to direct a gas flow to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

2. The lithographic apparatus of claim 1, wherein the protector is configured to separate the protected surface from the opposite side of the gas flow.

3. The lithographic apparatus of claim 1, wherein the at least one opening is configured to direct a gas flow substantially perpendicular to a contaminated flow of gas towards the component.

4. The lithographic apparatus of claim 1, wherein the protector is positioned between the protected surface and a part of the lithographic apparatus that is configured to move relative to the component.

5. The lithographic apparatus of claim 1, further comprising a gas blower on a side of the gas flow opposite to the component, the gas blower configured to supply a flow of conditioning gas, wherein the gas flow is configured to substantially prevent the flow of conditioning gas from reaching the same side of the gas flow as the protected surface.

6. The lithographic apparatus of claim 1, wherein the protector comprises a gas curtain.

7. The lithographic apparatus of claim 1, wherein the at least one opening is configured to direct a gas flow perpendicular to a surface in which the opening is disposed.

8. The lithographic apparatus of claim 1, wherein the at least one opening is configured to direct a gas flow along a path perpendicular to the surface other than the protected surface.

9. The lithographic apparatus of claim 1, wherein an entire surface of the component is on only one side of the gas flow.

10. The lithographic apparatus of claim 1, wherein the protection gas is maintained at an overpressure with respect to gas on the opposite side of the gas flow.

11. The lithographic apparatus of claim 1, wherein the protector further comprises a flow divider toward which the at least one opening is configured to direct the gas flow.

12. The lithographic apparatus of claim 1, wherein the protector comprises a flow divider configured to redirect towards the protected surface, the gas flow directed by the at least one opening and to redirect external gas away from the protected surface.

13. The lithographic apparatus of claim 1, further comprising:
a purge plate configured to substantially prevent gas from reaching the protected surface; and a purge plate extractor configured to extract gas provided by the at least one opening of the protector, wherein the purge plate extractor comprises an opening in the purge plate.

14. A lithographic apparatus comprising:
a component with a protected surface;
a surface shield configured to direct a flow of protection gas, in a protection volume, along a path contiguous to the protected surface to protect the protected surface; and
a protector comprising at least one opening configured to direct a gas flow distinct from the flow of protection gas,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

15. A lithographic apparatus comprising:
an illumination system having an objective, wherein a protected surface of the objective is in contact with a protection gas in a protection volume; and
a protector comprising at least one opening configured to direct a gas flow to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

16. A lithographic apparatus comprising:
a projection system having a lens, wherein a protected surface of the lens is in contact with a protection gas in a protection volume; and
a protector comprising at least one opening configured to direct a gas flow to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

17. An illumination system for a lithographic apparatus configured to condition a radiation beam, the illumination system comprising:
an optical component with a protected surface in contact with a protection gas in a protection volume; and
a protector comprising at least one opening configured to direct a gas flow to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

18. A projection system for a lithographic apparatus configured to project a patterned radiation beam onto a substrate, the projection system comprising:
an optical component with a protected surface in contact with a protection gas in a protection volume; and
a protector comprising at least one opening configured to direct a gas flow to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

19. A method of manufacturing a device using a lithographic apparatus comprising a component with a protected surface in contact with a protection gas in a protection volume, the method comprising:
directing a gas flow from at least one opening to a surface other than the protected surface along a path noncontiguous to the protected surface,
wherein the gas flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

20. A method of manufacturing a device using a lithographic apparatus comprising a component with a protected surface, the method comprising:
directing a protection gas, in a protection volume, along a path contiguous to the protected surface to protect the protected surface; and
directing a gas flow distinct from the protection gas from at least one opening,
wherein the as flow defines at least part of a boundary of the protection volume opposite to another boundary of the protection volume defined, at least in part, by the protected surface, and
wherein the gas flow substantially prevents gas from reaching a same side of the gas flow as the protected surface from an opposite side of the gas flow.

* * * * *